(12) United States Patent
Matsumoto et al.

(10) Patent No.: US 9,607,956 B2
(45) Date of Patent: Mar. 28, 2017

(54) SEMICONDUCTOR DEVICE AND METHOD OF MANUFACTURING THE SAME

(71) Applicant: Renesas Electronics Corporation, Tokyo (JP)

(72) Inventors: Masahiro Matsumoto, Kanagawa (JP); Kazuyoshi Maekawa, Kanagawa (JP); Masahiko Fujisawa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/165,265

(22) Filed: May 26, 2016

(65) Prior Publication Data

US 2016/0268222 A1   Sep. 15, 2016

Related U.S. Application Data

(62) Division of application No. 14/210,375, filed on Mar. 13, 2014, now Pat. No. 9,406,628.

(30) Foreign Application Priority Data

Mar. 21, 2013 (JP) ................................ 2013-059123

(51) Int. Cl.
*H01L 23/00* (2006.01)
*H01L 21/66* (2006.01)
*C22C 21/12* (2006.01)

(52) U.S. Cl.
CPC .............. *H01L 24/05* (2013.01); *H01L 22/32* (2013.01); *H01L 24/03* (2013.01); *H01L 24/06* (2013.01);

(Continued)

(58) Field of Classification Search
CPC ......... H01L 24/03; H01L 24/05; H01L 24/11; H01L 24/13
See application file for complete search history.

(56) References Cited

U.S. PATENT DOCUMENTS 4,176,443 A    12/1979 Iannuzzi et al.
5,235,212 A *  8/1993 Shimizu .............. H01L 23/3171
                                                257/780

(Continued)

FOREIGN PATENT DOCUMENTS

JP    H01-187832    7/1989
JP    2002-110799   4/2002

(Continued)

OTHER PUBLICATIONS

Office Action, issued May 31, 2016, in Japanese Patent Application No. 2013-059123.

*Primary Examiner* — Christine Enad
(74) *Attorney, Agent, or Firm* — Shapiro, Gabor and Rosenberger, PLLC

(57) ABSTRACT

A semiconductor device in which reliability of a bonding pad to which a conductive wire is bonded is achieved. A bonding pad having an OPM structure is formed of an Al—Cu alloy film having a Cu concentration of 2 wt % or more. By increasing the Cu concentration, the Al—Cu alloy film forming the bonding pad is hardened. Therefore, the bonding pad is difficult to be deformed by impact in bonding of a Cu wire, and deformation of an OPM film as following the deformation of the bonding pad can be reduced. In this manner, concentration of a stress on the OPM film caused by the impact from the Cu wire can be reduced, and therefore, the breakage of the OPM film can be prevented.

5 Claims, 21 Drawing Sheets

(52) U.S. Cl.
CPC .............. *H01L 24/48* (2013.01); *C22C 21/12* (2013.01); *H01L 24/45* (2013.01); *H01L 24/85* (2013.01); *H01L 2224/02126* (2013.01); *H01L 2224/0346* (2013.01); *H01L 2224/0347* (2013.01); *H01L 2224/03464* (2013.01); *H01L 2224/04042* (2013.01); *H01L 2224/05083* (2013.01); *H01L 2224/05124* (2013.01); *H01L 2224/05147* (2013.01); *H01L 2224/05155* (2013.01); *H01L 2224/05171* (2013.01); *H01L 2224/05553* (2013.01); *H01L 2224/05554* (2013.01); *H01L 2224/05556* (2013.01); *H01L 2224/05582* (2013.01); *H01L 2224/05644* (2013.01); *H01L 2224/05647* (2013.01); *H01L 2224/05664* (2013.01); *H01L 2224/29339* (2013.01); *H01L 2224/45144* (2013.01); *H01L 2224/45147* (2013.01); *H01L 2224/48227* (2013.01); *H01L 2224/48247* (2013.01); *H01L 2224/48644* (2013.01); *H01L 2224/48664* (2013.01); *H01L 2224/48844* (2013.01); *H01L 2224/48864* (2013.01); *H01L 2224/78301* (2013.01); *H01L 2224/85045* (2013.01); *H01L 2224/85203* (2013.01); *H01L 2224/85205* (2013.01); *H01L 2224/85207* (2013.01); *H01L 2924/01322* (2013.01); *H01L 2924/1306* (2013.01); *H01L 2924/351* (2013.01)

(56) References Cited

U.S. PATENT DOCUMENTS

| | | | |
|---|---|---|---|
| 6,403,462 B1 * | 6/2002 | Hasunuma | H01L 21/32051 257/E21.576 |
| 6,747,351 B2 * | 6/2004 | Yamaguchi | H01L 21/288 257/737 |
| 2002/0037643 A1 | 3/2002 | Ishimaru | |
| 2005/0003580 A1 | 1/2005 | Arai et al. | |
| 2008/0203568 A1 | 8/2008 | Tanaka et al. | |
| 2009/0008783 A1 | 1/2009 | Saigoh et al. | |
| 2009/0243038 A1 * | 10/2009 | Nagai | H01L 24/03 257/532 |
| 2010/0133688 A1 | 6/2010 | Shigihara et al. | |
| 2011/0062585 A1 | 3/2011 | Tanaka et al. | |
| 2011/0241204 A1 | 10/2011 | Tanaka et al. | |
| 2012/0056322 A1 * | 3/2012 | Saigoh | H01L 23/3157 257/737 |
| 2012/0306077 A1 | 12/2012 | Tanaka et al. | |

FOREIGN PATENT DOCUMENTS

| | | |
|---|---|---|
| JP | 2008-060298 | 3/2008 |
| JP | 2009-177104 A | 8/2009 |
| JP | 2010-157683 | 7/2010 |
| JP | 2010-205974 A | 9/2010 |
| JP | 2012-146720 | 8/2012 |

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2013-059123 filed on Mar. 21, 2013, the content of which is hereby incorporated by reference into this application.

TECHNICAL FIELD OF THE INVENTION

The present invention relates to a semiconductor device and a technique of manufacturing the same, and can be preferably utilized to a semiconductor device having, for example, an electrode pad on which a conductive wire is bonded or an electrode pad with which a measuring probe is brought into contact.

BACKGROUND

In recent years, an electrode pad made of an Al—Cu alloy having a resistance lower than that of an Al—Si—Cu alloy and having a high electromigration resistance has been used.

For example, Japanese Patent Application Laid-Open Publication No. 2009-177104 (Patent Document 1) discloses a technique of improving reliability of a bonding region between an Al—Cu pad and a CuP wire in a high-temperature operation by providing a plurality of alloy layers whose Al—Cu composition ratios are different from each other to the bonding region between the Al—Cu pad and the CuP wire.

Also, Japanese Patent Application Laid-Open Publication No. 2010-205974 (Patent Document 2) discloses a technique of suppressing formation of a non-bonding part in a Cu wire by covering the uppermost surface of an electrode with an Al—Cu compound layer.

SUMMARY

In an electrode pad made of an Al—Cu alloy and having an over pad metal structure (hereinafter, referred to as "OPM structure"), an over pad metal film located between a conductive wire and an electrode pad may be broken by impact caused when the conductive wire is bonded to the electrode pad. Also, a shear stress occurs in a region near a corner of a semiconductor chip on the electrode pad made of the Al—Cu alloy due to the thermal shrinkage of a sealing resin used for protecting a principal surface of the semiconductor chip, and this shear stress may break an end of a surface protective film positioned in an upper surface of this electrode pad. Therefore, there is such a problem that the electrode pad included in the semiconductor chip does not have sufficient reliability.

The other problems and novel characteristics will be apparent from the description of the present specification and the accompanying drawings.

According to an embodiment, the electrode pad having the OPM structure is formed of an Al—Cu alloy film with a Cu concentration of 2 wt % or more. The Al—Cu alloy film that forms the electrode pad is hardened by increasing the Cu concentration, so that the deformation of the electrode pad caused by the impact caused when the conductive wire is bonded and the deformation of the electrode pad due to the shear stress caused by the thermal shrinkage of the sealing resin are suppressed.

According to an embodiment, a semiconductor device in which the reliability of the electrode pad included in the semiconductor chip is improved can be achieved.

BRIEF DESCRIPTIONS OF THE DRAWINGS

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, numerical values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, when terms "formed of A", "formed by A", "having A", and "including A" are mentioned, it goes without saying that other components are not eliminated unless otherwise specified to be only the component. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used in some cases even in a plan view so as to make the drawings easy to see. Moreover, in the following embodiments, the term "wafer" mainly indicates a silicon (Si) single-crystal wafer and it indicates not only the same but also a silicon on insulator (SOI) wafer, an insulating film substrate for forming an integrated circuit thereon, or the like. The shape of the wafer includes not only a circular shape or a substantially circular shape but also a square shape, a rectangular shape, and the like. Also, an over pad metal film configuring an OPM structure is abbreviated as an OPM film, an over pad metal adhesion film is abbreviated as an OPM adhering film, and an over pad metal electrode film is abbreviated as an OPM electrode film.

Further, components having the same function are denoted by the same reference symbols throughout the all drawings for describing the following embodiments, and the repetitive description thereof will be omitted. Hereinafter, the embodiments will be described in detail based on the accompanying drawings.

(First Embodiment)

<<Structure of Semiconductor Device>>

Figure 1:
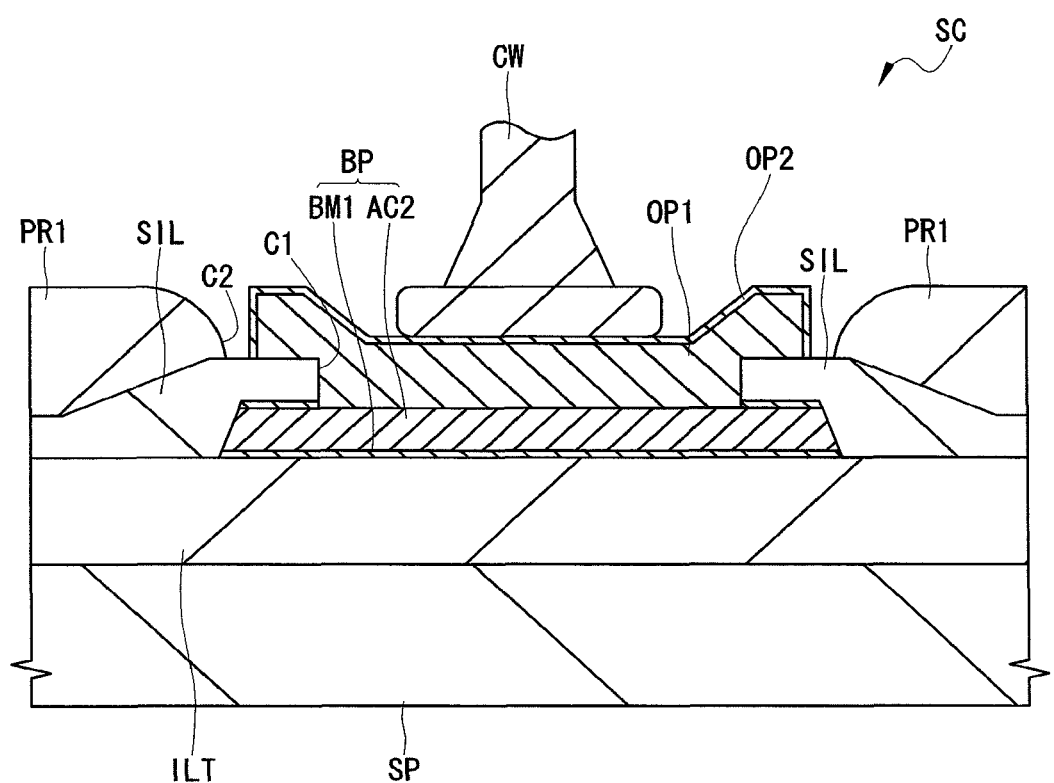
FIG. 1 is a cross-sectional view of a principle part of a bonding pad portion for explaining a configuration of a bonding pad having an OPM structure according to a first embodiment.
Figure 2:
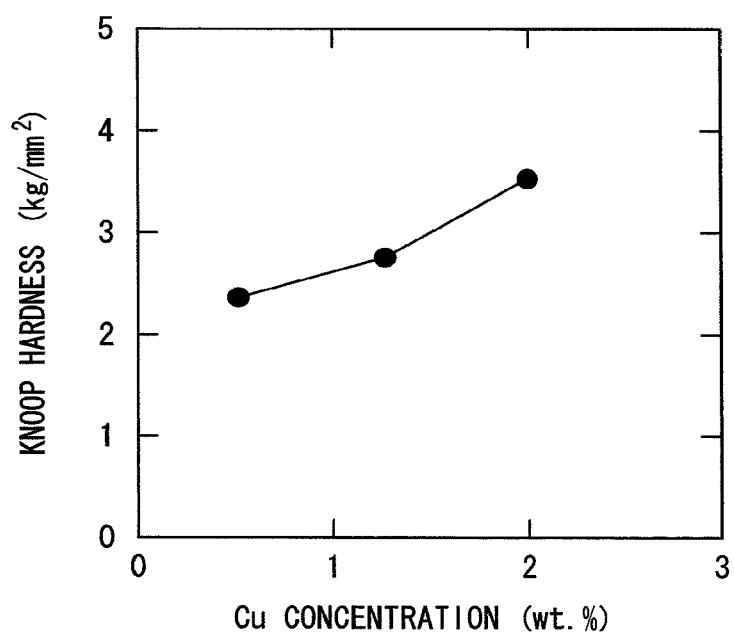
FIG. 2 is a graph for explaining relation between a Knoop hardness and a Cu concentration of an Al—Cu alloy according to the first embodiment.
Figure 3:
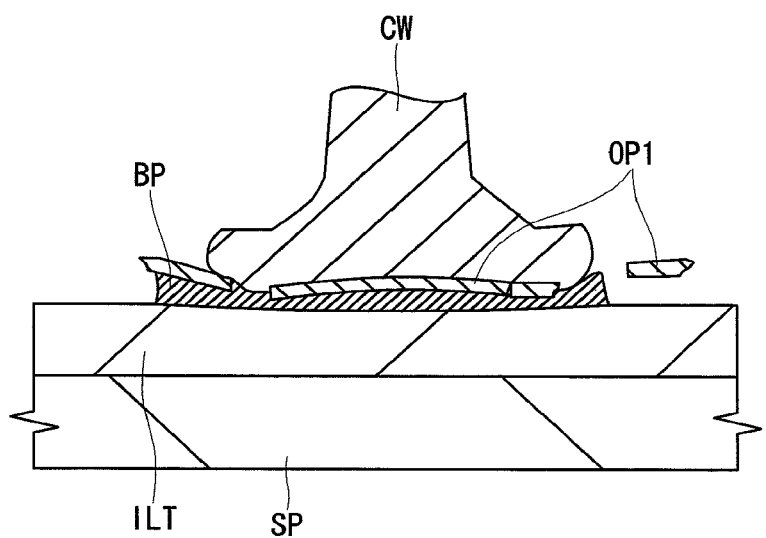
FIG. 3 is a cross-sectional view of a principal part of the bonding pad portion for explaining a breaking mechanism in an over pad metal film.

A configuration of a semiconductor device according to a first embodiment will be described with reference to FIGS. 1 to 3. FIG. 1 is a cross-sectional view of a principal part of a bonding pad portion for explaining a configuration of a bonding pad having an OPM structure. FIG. 2 is a graph for explaining the relation between a Knoop hardness and a Cu concentration of an Al—Cu alloy. FIG. 3 is a cross-sectional view of a principal part of the bonding pad portion for explaining a breaking mechanism in the OPM film.

<Bonding Pad>

As illustrated in FIG. 1, an insulating film ILT covering a plurality of semiconductor elements is formed on a principal surface of a semiconductor substrate SP. On this insulating film ILT, a plurality of bonding pads BP (which are also referred to as electrode pads) electrically connected to the plurality of semiconductor elements are formed. Each of the bonding pads BP is made of a conductive material in the same layer as the uppermost-layer wire of multi-layered wires.

Further, a surface protective film SIL is formed on the principal surface of the semiconductor substrate SP so as to cover the bonding pads BP. An upper surface of the bonding pad BP is partially exposed by an opening C1 formed on the surface protective film SIL so as to correspond to the bonding pad BP.

The bonding pad BP is mainly formed of an Al (aluminum)-Cu (copper) alloy film AC2 to which Cu of 2 wt % or more is added, and a barrier metal film BM1 is formed on a lower surface of the Al—Cu alloy film AC2. The barrier metal film BM1 has a function of improving the adhesive property of Al or Cu, and is formed of, for example, a Ti (titanium) film, TiN (titanium nitride) film, or a stacked film formed by stacking the Ti film and the TiN film.

A thickness of the Al—Cu alloy film AC2 is, for example, 0.3 μm to 3.0 μm, and is most preferably, for example, 0.8 μm to 2.0 μm. A thickness of the barrier metal film BM1 is, for example, 0.02 μm to 0.2 μm.

As illustrated in FIG. 2, the Knoop hardness of the Al—Cu alloy film is higher as the Cu concentration to be added to the Al—Cu alloy film is more. Therefore, since the Cu of 2 wt % or more is added to the Al—Cu alloy film AC2 forming the bonding pad BD, the Knoop hardness of the Al—Cu alloy film AC2 is 3 kg/mm$^2$ or higher.

<Over Pad Metal Film and Over Pad Metal Adhesion Film>

Further, as illustrated in FIG. 1 described above, the bonding pad portion is configured as the bonding pad having the OPM structure in which an OPM film OP1 and an OPM adhesion film OP2 are formed on an upper surface of the bonding pad BP.

That is, a polyimide resin film PR1 is formed on the surface protective film SIL, and the OPM film OP1 is formed so as to be connected with the upper surface of the bonding pad BP exposed from an opening C2 formed in the polyimide resin film PR1 and an opening C1 formed in the surface protective film SIL. The OPM film OP1 is formed of, for example, a Ni (nickel) film, a Ti film, a Cr (chromium) film, a stacked film formed by stacking any of them, or others, and has a thickness of, for example, 0.5 μm to 4.0 μm, and, most preferably, for example, 1.0 μm to 3.0 μm.

And, the OPM adhesion film OP2 is formed on a surface of the OPM film OP1. The OPM adhesion film OP2 is formed of, for example, a Pd (palladium) film, an Au (gold) film, a stacked film formed by stacking the Pd film and the Au film, or others, and has a thickness of, for example, 0.05 μm to 3.0 μm, and, most preferably, for example, 0.05 μm to 0.5 μm.

When the OPM film OP1 and the OPM adhesion film OP2 are not arranged on the upper surface of the bonding pad BP, a conductive wire (for example, a Cu wire CW described later) is to be connected directly to the bonding pad BP. In this case, an intermetallic compound (for example, Cu—Al compound) is formed between the wire material (for example, Cu) which is the conductive wire and the conductive material (for example, Al) of the bonding pad BP in an operation under a high-temperature environment or in a high-temperature preservation test (for example, high-temperature preservation test at 150° C. to 200° C.). Voids are formed between the conductive wire and the bonding pad BP by the formation of the intermetallic compound, and the bonding strength between the conductive wire and the bonding pad BP may be reduced.

Accordingly, in the first embodiment, the bonding pad having the OPM structure in which the OPM film OP1 and the OPM adhesion film OP2 are arranged on the upper surface of the bonding pad BP so that the conductive wire is not connected directly to the bonding pad BP is adopted.

Also in the bonding pad having the OPM structure, the intermetallic compound (for example, Cu—Pd compound) is formed by the reaction of the wire material (for example, Cu) of the conductive wire with the OPM adhesion film OP2 (for example, Pd) in the high-temperature heat treatment. However, this intermetallic compound does not react with the OPM film OP1, and therefore, the bonding strength between the conductive wire and the bonding pad BP is not reduced, so that the reliability of the bonding part of the conductive wire can be improved.

In addition, the OPM adhesion film OP2 can improve the adhesion property between the conductive wire and the OPM film OP1, and besides, can improve the corrosion resistance property and the heat resistance property of the bonding pad BP.

<Bonding Wire>

And, as illustrated in FIG. 1 described above, one end of the CU wire CW which is the conductive wire is electrically connected to the OMP film OP1 via the OPM adhesion film OP2. The Cu wire CW is electrically connected to the OPM film OP1 by a nail head bonding method (alternatively, also referred to as a ball bonding method) using combination of thermal compression bonding and ultrasonic vibration. Specifically, a tip of the Cu wire CW is melted by arc discharge to form a ball by surface tension, and the ball is thermally compressed and bonded onto the upper surface of the bonding pad BP by using a capillary (a cylindrical connection jig) as applying the ultrasonic vibration of, for example, 120 kHz.

Incidentally, a Cu wire or Au wire is mainly used as the conductive wire. The Cu wire is cheaper than the Au wire, and therefore, the mainstream in recent years is to use the Cu wire. However, the Cu wire is harder than the Au wire. Therefore, in order to bond the Cu wire to the bonding pad, it is required to apply a higher load to the bonding pad than a load in the bonding of the Au wire to the bonding pad.

Therefore, when the Cu wire CW is used in the explanation in, for example, FIG. 1 described above, the load is applied also to the OPM adhesion film OP2, to the OPM film OP1, to the bonding pad BP, and to the insulating film ILT, which are positioned below the Cu wire CW.

At this time, if the bonding pad BP has low hardness, a stress caused in the bonding of the Cu wire CW concentrates on the OPM film OP1 as illustrated in FIG. 3, and the OPM film OP1 may be broken. That is, if the bonding pad BP is soft while the OPM film OP1 is hard, the bonding pad BP is compressed and deformed by the impact from the Cu wire CW. However, the OPM film OP1 cannot follow to be deformed as the deformation of the bonding pad BP. Therefore, it seems that the stress due to the impact from the Cu wire CW concentrates on the OPM film OP1. Note that the OPM adhesion film OP2 can follow to be deformed as the deformation of the bonding pad BP because of thin and soft.

However, in the first embodiment, the hardness of the bonding pad BP is increased by forming the bonding pad BP by the Al—Cu alloy film AC2 having the Cu concentration of 2 wt % or more as described above. Therefore, if the bonding pad BP is hard and the OPM film OP1 is hard, the boding pad BP is difficult to be deformed against the impact from the Cu wire CW, and therefore, the deformation of the OPM film OP1 so as to follow as the deformation of the bonding pad BP can be reduced. In this manner, the concentration of the stress on the OPM film OP1 due to the impact from the Cu wire CW can be reduced, so that the breakage of the OPM film OP1 can be prevented. The present inventors have confirmed that the OPM film OP1 is not broken in the bonding pad BP formed of the Al—Cu alloy film AC2 having the Cu concentration of 2 wt %.

<<Method of Manufacturing Semiconductor Device>>

Figure 4:
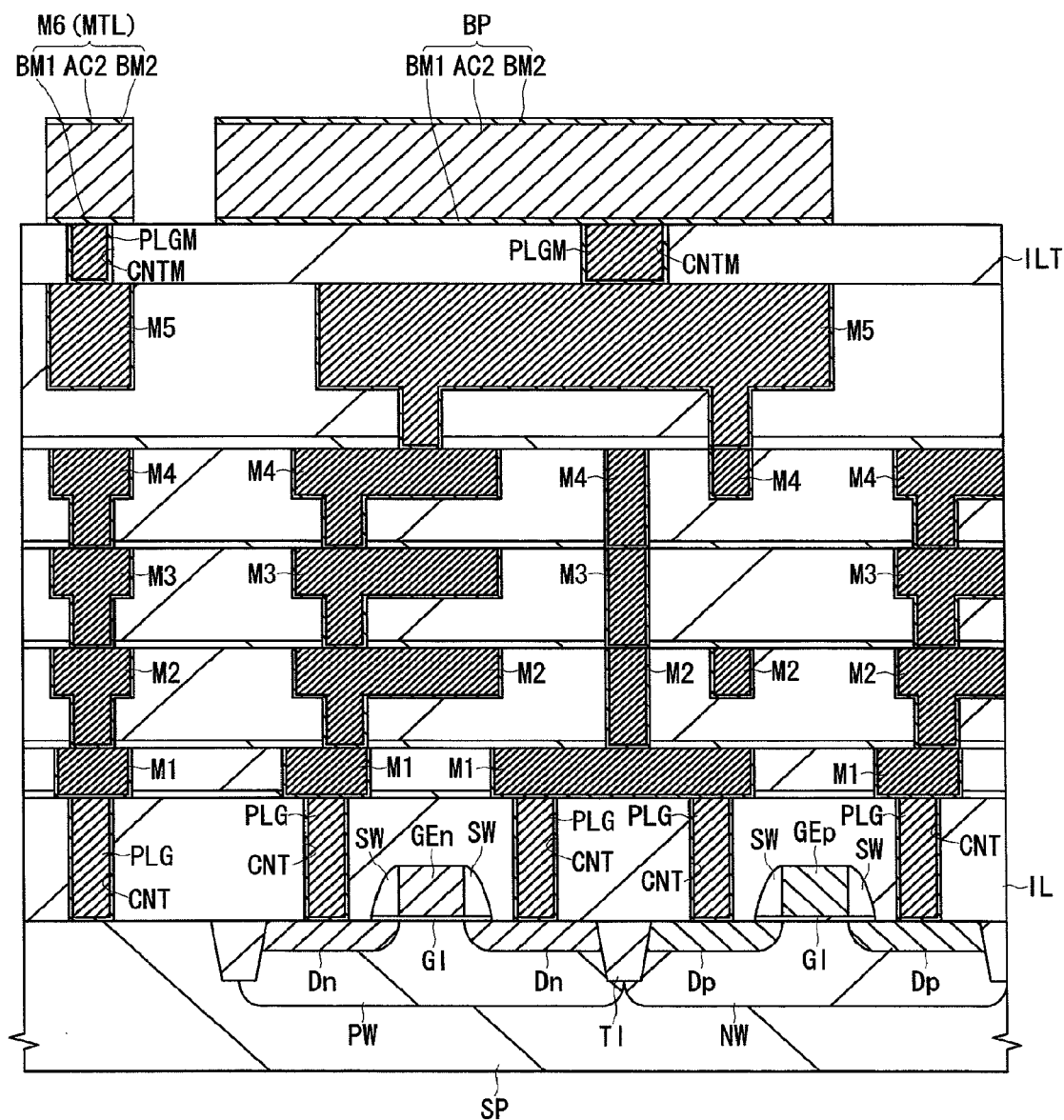
FIG. 4 is a cross-sectional view of a principal part of a semiconductor device including a CMOS device and a multilayered wire according to the first embodiment.

Next, an example of a method of manufacturing a semiconductor device according to the first embodiment will be described in the order of steps with reference to FIGS. 4 to 9. FIG. 4 is a cross-sectional view of a principal part of a semiconductor device including a CMOS (Complementary Metal Oxide Semiconductor) device and a multilayered wire, and FIGS. 5 to 9 are cross-sectional views of principal parts illustrating an enlarged region of the bonding pad having the OPM structure from which the CMOS device is eliminated.

[Step of Preparing Semiconductor Chip]

First, as illustrated in FIG. 4, a desired semiconductor element is formed on the principal surface of the semiconductor substrate SP (which is a planar and substantially circular thin semiconductor plate called semiconductor wafer at this stage) made of the silicon single crystal. While, for example, the CMOS device, a resistance element, a capacitance element, etc., are formed as the semiconductor elements, the CMOS device is exemplified in the first embodiment. A p-channel type MISFET (Metal Insulator Semiconductor Field Effect Transistor) forming the CMOS device is referred to as a p-MIS transistor, and an n-channel type MISFET is referred to as an n-MIS transistor.

An isolation portion TI made of an insulating film is formed in an element isolation region of the semiconductor substrate SP, and then, an impurity showing p-type conductivity is ion-implanted to the semiconductor substrate SP to form a p-well PW. Similarly, an impurity showing n-type conductivity is ion-implanted thereto to form an n-well NW. Subsequently, a gate insulating film GI and gate electrodes GEn and GEp forming an n-MIS transistor and a p-MIS transistor are formed, and besides, a side wall SW is formed on sidewalls of the gate electrodes GEn and GEp.

Next, an impurity showing n-type conductivity is ion-implanted to the p-wells PW on both sides of the gate electrode GEn to form an n-type semiconductor region Dn, which functions as source/drain of the n-MIS transistor, in self alignment form for the gate electrode GEn and the sidewalls SW. Similarly, an impurity showing p-type conductivity is ion-implanted to the n-wells NW on both sides of the gate electrode GEp to form a p-type semiconductor region Dp, which functions as source/drain of the p-MIS transistor, in self alignment form for the gate electrode GEp and the sidewalls SW.

Next, an insulating film IL is formed on the semiconductor substrate SP, and then, the insulating film IL is processed by an etching process by using a resist pattern as a mask, so that a connection hole CNT is formed. This connection hole CNT is formed on necessary portions, which are above the n-type semiconductor region Dn, the p-type semiconductor region Dp, etc. Subsequently, inside the connection hole CNT, a plug PLG containing W (tungsten) as a main conductor is formed, and then, a first layer wire M1 to be connected to the plug PLG is formed. The wire M1 contains, for example, Cu as a main conductor, and is formed by a single damascene method.

Further, a second layer wire M2 to a fifth layer wire M5 which are upper layers are formed. The wires M2, M3, M4, and M5 contain, for example, Cu as a main conductor, and are formed by a dual damascene method.

Next, on the wire M5, the insulating film ILT formed of a silicon oxide film or a TEOS (Tetra Ethyl Ortho Silicate) film is formed. A thickness of the insulating film ILT is, for example, 0.3 μm to 3.0 μm, and, most preferably, for example, 0.8 μm to 2.0 μm. Subsequently, the insulating film ILT is processed by an etching process by using a resist pattern as a mask, so that a connection hole CNTM is formed so as to reach the wire M5, and then, a plug PLGM containing, for example, W as a main conductor is formed inside the connection hole CNTM.

Next, the bonding pad BP and a sixth layer wire M6 electrically connected to the plug PLGM are formed on the insulating film ILT. The wire M6 is the uppermost layer wire, and corresponds to the uppermost layer wire MTL described above with reference to FIG. 1.

The wire M6 is formed by sequentially depositing the barrier metal film BM1 and the Al—Cu alloy film AC2 in a lower layer and depositing the barrier metal film BM2 in an upper layer on the insulating film ILT, and then, etching these films by using a resist pattern as a mask. Also, at the same time with the formation of the wire M6, the bonding pad BP formed of the barrier metal film BM1 and the Al—Cu alloy film AC2 in the lower layer and the barrier metal film BM2 in the upper layer is also formed. Each of the barrier metal films BM1 and BM2 is formed of, for example, a Ti film, a TiN film, a stacked film formed by stacking the Ti film and TiN film, or others, and has a thickness of, for example, 0.02 μm to 0.2 μm.

Each of the bonding pad BP and the wire M6 is formed of the Al—Cu alloy film AC2 having the Cu concentration of 2 wt % or more. A thickness of the Al—Cu alloy film AC2 is, for example, 0.3 μm to 3.0 μm, and, most preferably, for example, 0.8 μm to 2.0 μm. In the first embodiment, note that six layers are adopted as the wiring layer. However, the number of layers is not limited to this number.

Figure 5:
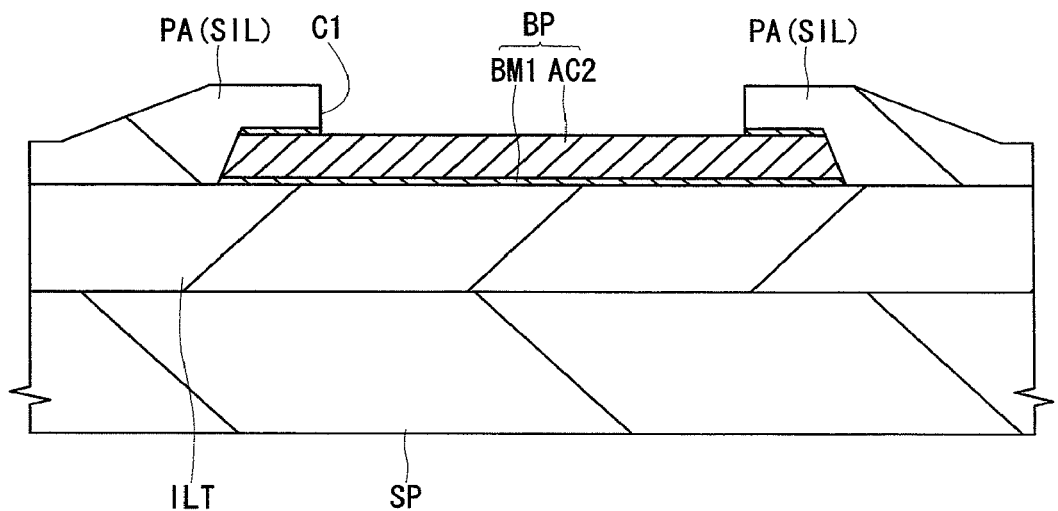
FIG. 5 is a cross-sectional view of a principal part illustrating an enlarged region of the bonding pad having the OPM structure for explaining a method of manufacturing the semiconductor device according to the first embodiment.

Next, as illustrated in FIG. 5, a silicon nitride film PA is formed on the bonding pad BP and the wire M6. The silicon nitride film PA is the surface protective film SIL described above with reference to FIG. 1. The silicon nitride film PA functions as a passivation film for preventing the approach of external moisture and impurities and suppressing transmission of α-rays. Instead of the silicon nitride film PA, a silicon oxide film may formed, or a stacked film of the silicon nitride film and the silicon oxide film may be formed. A thickness of the silicon nitride film PA is, for example, 0.5 μm to 2.0 μm.

Subsequently, the silicon nitride film PA is processed by an etching process by using a resist pattern as a mask, so that the opening C1 from which an upper surface of the bonding pad BP is exposed is formed in the silicon nitride film PA. By this etching process, the barrier metal film BM1 exposed from bottom of the opening C1 is removed, and the Al—Cu alloy film AC2 forming the bonding pad PB is exposed from the bottom of the opening C1.

Figure 6:
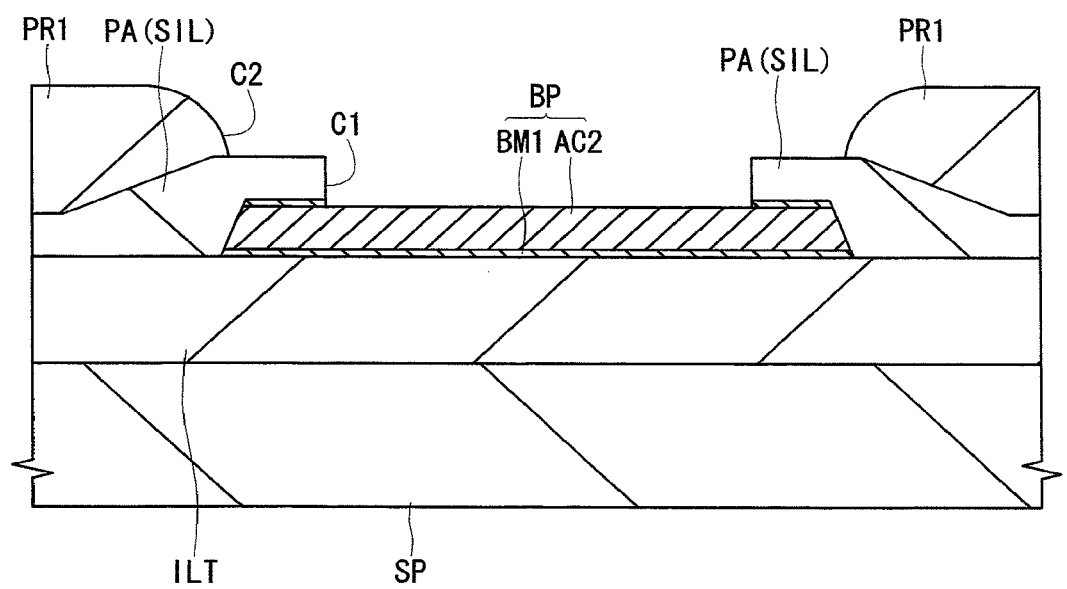
FIG. 6 is a cross-sectional view of a principal part of the same portion as that of FIG. 5 in processes of manufacturing the semiconductor device, continued from FIG. 5.

Next, as illustrated in FIG. 6, the silicon nitride film PA is coated with a polyimide resin PR1. Subsequently, the polyimide resin PR1 is processed by a lithographic method so that an opening C2 larger than the opening C1 is formed in the polyimide resin PR1 as overlapping the opening C1.

Figure 7:
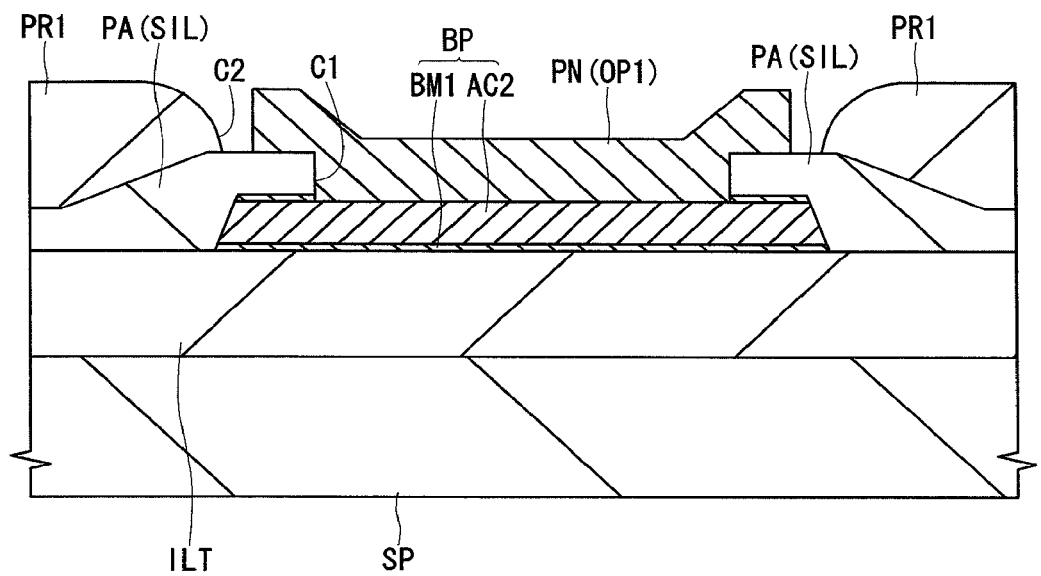
FIG. 7 is a cross-sectional view of a principal part of the same portion as that of FIG. 5 in processes of manufacturing the semiconductor device, continued from FIG. 6.

Next, as illustrated in FIG. 7, a Ni plating film PN is grown on the upper surfaces of the bonding pads BP exposed on the openings C1 and C2 by electroless plating. The Ni plating film PN corresponds to the OPM film OP1 described above with reference to FIG. 1. A thickness of the Ni plating film PN is, for example, 0.5 μm to 4.0 μm, and, most preferably, for example, 1.0 μm to 3.0 μm. Instead of the Ni plating film PN, for example, a Ti plating film, etc., may be formed.

Figure 8:
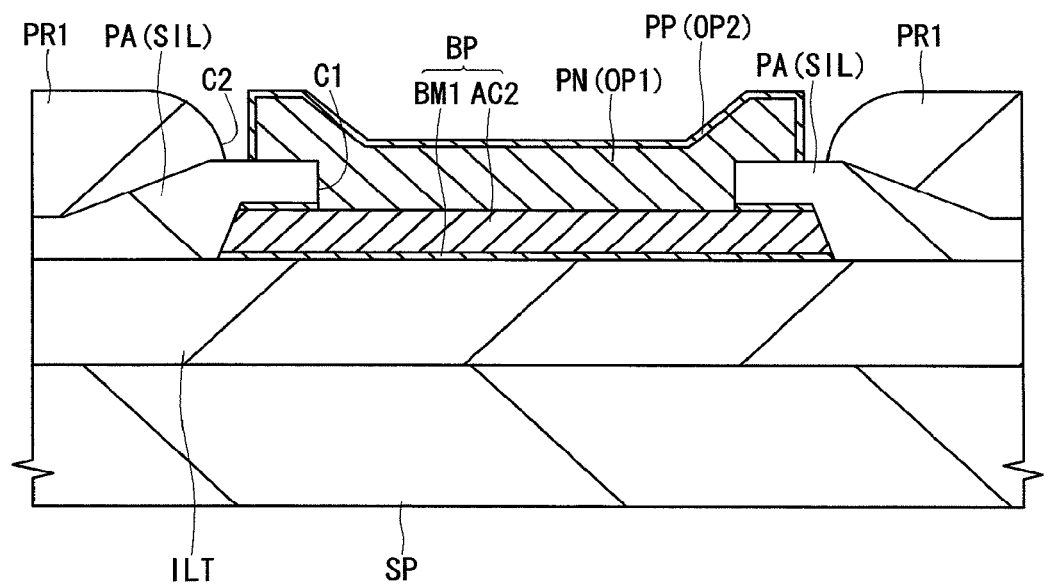
FIG. 8 is a cross-sectional view of a principal part of the same portion as that of FIG. 5 in processes of manufacturing the semiconductor device, continued from FIG. 7.

Subsequently, as illustrated in FIG. 8, a Pd plating film PP is grown on the upper surface of the Ni plating film PN, by electroless plating. The Pd plating film PP is the OPM adhesion film OP2 described above referring to FIG. 1. The thickness of the Pd plating film PP is, for example, 0.05 μm to 3.0 μm, and is most preferably, for example, 0.05 μm to 0.5 μm. For example, an Au plating film, etc., may be formed in place of the Pd plating film PP.

Through the above-described processes, the semiconductor devices are formed on the semiconductor substrate SP in a unit of a semiconductor chip.

[Step of Preparing Lead Frame]

Each of the semiconductor devices formed on the semiconductor substrate SP is determined as a defective product or a non-defective product, and then, the semiconductor substrate SP is separated into the semiconductor chips by a dicing process.

Next, a lead frame (alternatively, also referred to as a wiring member or a board) which is a metal frame mainly made of, for example, Cu is prepared. The lead frame has a structure in which unit frames each corresponding to one semiconductor product are arranged in matrix form. At the center of each unit frame, a die pad (alternatively, also referred to as a tab or a chip mounting portion) on which the semiconductor chip is mounted is provided, and a plurality of leads (alternatively, also referred to as external terminals) are provided so as to be separated from the die pad and so as to surround the die pad.

[Step of Die Bonding]

Next, the semiconductor chip determined as the non-defective product is mounted on an upper surface of the die pad of each unit frame. At this time, the upper surface of the die pad is bonded to a back surface of the semiconductor chip by using, for example, a paste-like adhesive (for example, Ag (silver) paste) or eutectic Au—Sn (tin).

[Step of Wire Bonding]

Figure 9:
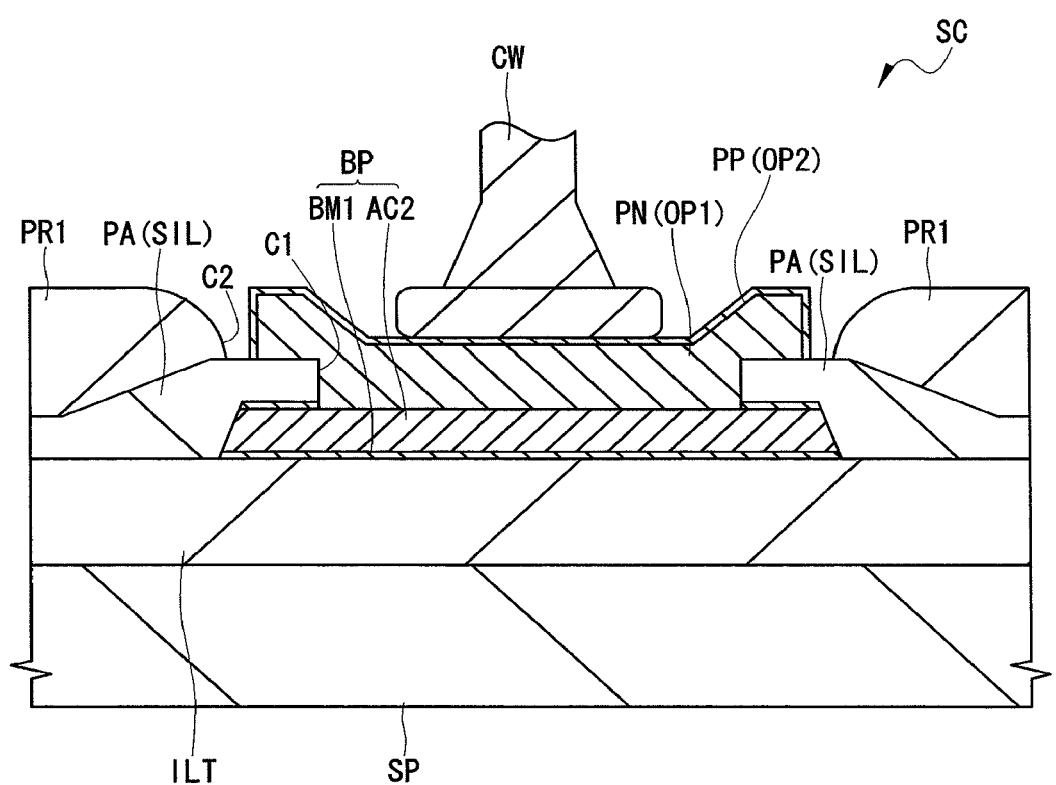
FIG. 9 is a cross-sectional view of a principal part of the same portion as that of FIG. 5 in processes of manufacturing the semiconductor device, continued from FIG. 8.

Next, as illustrated in FIG. 9, the plurality of bonding pads BP having the OPM structure formed on the principal surface of a semiconductor chip SC are electrically connected to a plurality of leads via the plurality of Cu wires CW, respectively, by a nail head bonding method (alternatively, also referred to as a ball bonding method) using combination of thermal compression bonding and the ultrasonic vibration. Specifically, one end of the Cu wire CW is melted by arc discharge to form a ball by surface tension, and the ball is thermally compressed and bonded onto the upper surface of the Ni plating film PN via the Pd plating film PP by using a capillary as applying ultrasonic vibration of, for example, 120 kHz. Further, the other end of the Cu wire CW is also melted by arc discharge to form a ball by surface tension, and the ball is thermally compressed and bonded onto an upper surface of the lead by using a capillary as applying ultrasonic vibration of, for example, 120 kHz.

Also, mainly, a forward bonding method (by which is connected to the bonding pad BP having the OPM structure in the semiconductor chip SC, and then, the other end of the Cu wire CW is connected to the lead) is usually adopted. However, a reverse bonding method (by which one end of the Cu wire CW is connected to the lead, and then, the other end of the Cu wire CW is connected to the bonding pad BP having the OPM structure in the semiconductor chip SC) may be also adopted.

The bonding pad BP is formed of the hard Al—Cu alloy film AC2 having the added Cu concentration of 2 wt % or more and the Knoop hardness of 3 kg/mm$^2$ or higher. In this manner, the deformation of the bonding pad BP is reduced in the bonding of the Cu wire, and the deformation of the Ni plating film PN following to be deformed as the deformation of the bonding pad BP is reduced, and therefore, the stress does not concentrate on the Ni plating film PN, so that the breakage of the Ni plating film PN can be prevented. In addition, since the Pd plating film PP is formed on the upper surface of the Ni plating film PN, the bonding property between the Ni plating film PN and the Cu wire CW is improved.

Then, through a mold step, a lead cutting step, a forming step, an inspection step, etc., the semiconductor device determined as the non-defective product is delivered out.

In this manner, in the bonding pad having the OPM structure BP in the first embodiment, the reliability of the bonding pad BP having the OPM structure to which the Cu wire CW is bonded is improved by forming the bonding pad PB by using the Al—Cu alloy film AC2 having the added Cu concentration of 2 wt % or more.

(Modified Example of First Embodiment)

<<Structure of Semiconductor Device>>

Figure 10:
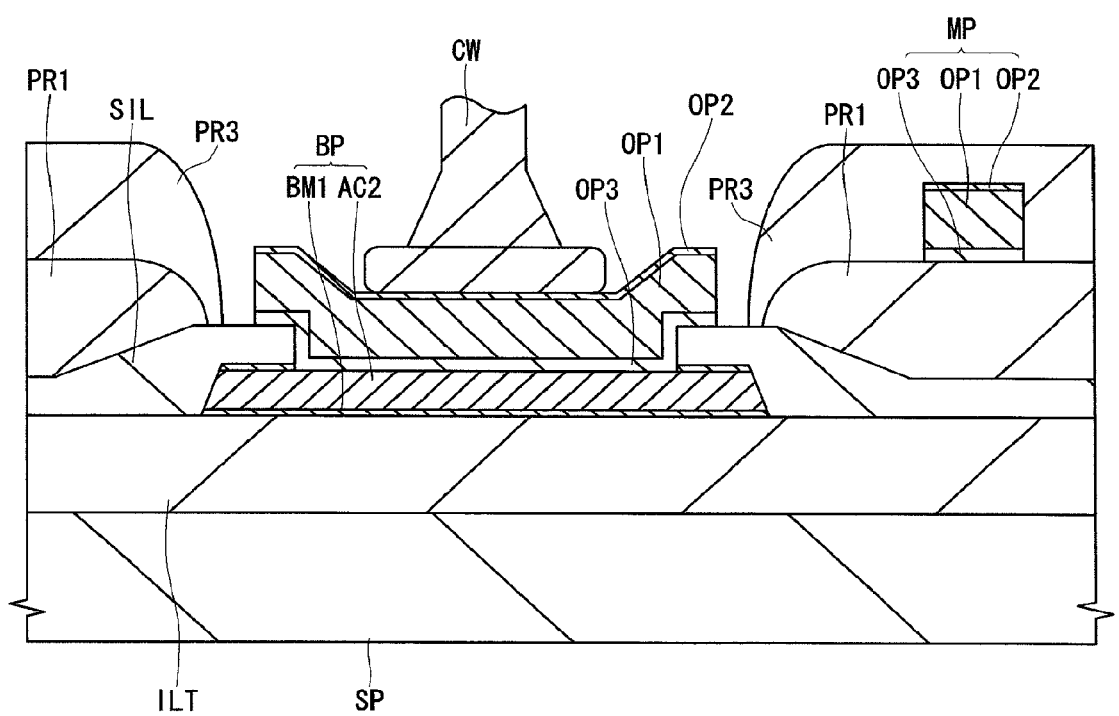
FIG. 10 is a cross-sectional view of a principle part of a bonding pad portion for explaining a configuration of a bonding pad having an OPM structure according to a modified example of the first embodiment.

A configuration of a semiconductor device according to a modified example of the first embodiment will be described with reference to FIG. 10. FIG. 10 is a cross-sectional view of a principal part of a bonding pad portion for explaining a configuration of a bonding pad having an OPM structure.

As illustrated in FIG. 10, the bonding pad BP having the OPM structure according to the modified example of the first embodiment is different from the bonding pad BP having the OPM structure illustrated in FIG. 1 described above in that an OPM electrode film OP3 is formed between the bonding pad BP and the OPM film OP1. The OPM electrode film OP3 is formed of, for example, a Ti film, a Pd film, a Cr film, a Cu film, or a stacked film formed by stacking any of them, and has a thickness of, for example, 0.1 µm to 0.5 µm.

Further, on the polyimide resin film PR1, a wire (hereinafter, referred to as an "OPM wire") MP is formed by a stacked film made of the OPM film OP1, the OPM adhesion film OP2, and the OPM electrode film OP3. The OPM wire MP is covered with a polyimide resin PR3.

Other configurations are the same as those of the bonding pad having the OPM structure illustrated in FIG. 1 described above so that Cu of 2 wt % or more is added to the Al—Cu alloy film AC2 forming the bonding pad BP.

<<Method of Manufacturing Semiconductor Device>>

Next, an example of a method of manufacturing a semiconductor device according to the modified example of the first embodiment will be described in the order of steps with reference to FIGS. 11 to 19. FIGS. 11 to 19 are cross-sectional views of a principal part illustrating an enlarged region of the bonding pad having the OPM structure.

As described above with reference to FIGS. 4 and 5, the bonding pad BP is formed on the insulating film ILT. Here, the added Cu concentration of the Al—Cu alloy film AC2 forming the bonding pad BP is 2 wt % or more, and a thickness of the Al—Cu alloy film AC2 is, for example, 0.3 µm to 3.0 µm, and, most preferably, for example, 0.8 µm to 2.0 µm.

Figure 11:
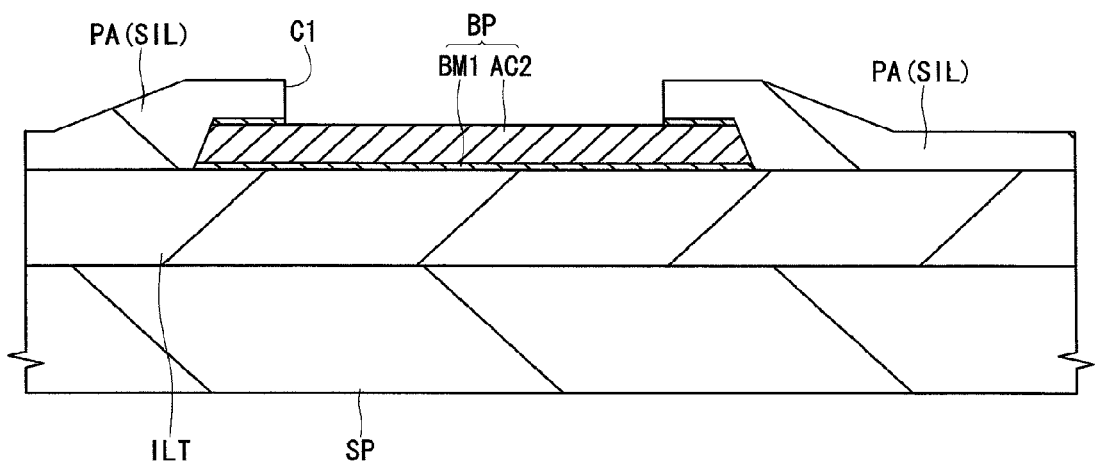
FIG. 11 is a cross-sectional view of a principal part illustrating an enlarged region of the bonding pad having the OPM structure for explaining a method of manufacturing the semiconductor device according to the modified example of the first embodiment.

Next, as illustrated in FIG. 11, the silicon nitride film PA (surface protective film SIL in FIG. 10 described above) is formed on the principal surface of the semiconductor substrate SP as described above with reference to FIGS. 6 and 7. Subsequently, the opening C1 from which a part of the upper surface of the bonding pad BP is exposed is formed in the silicon nitride film PA, so that the Al—Cu alloy film AC2 forming the bonding pad BP is exposed from the bottom of the opening C1.

Figure 12:
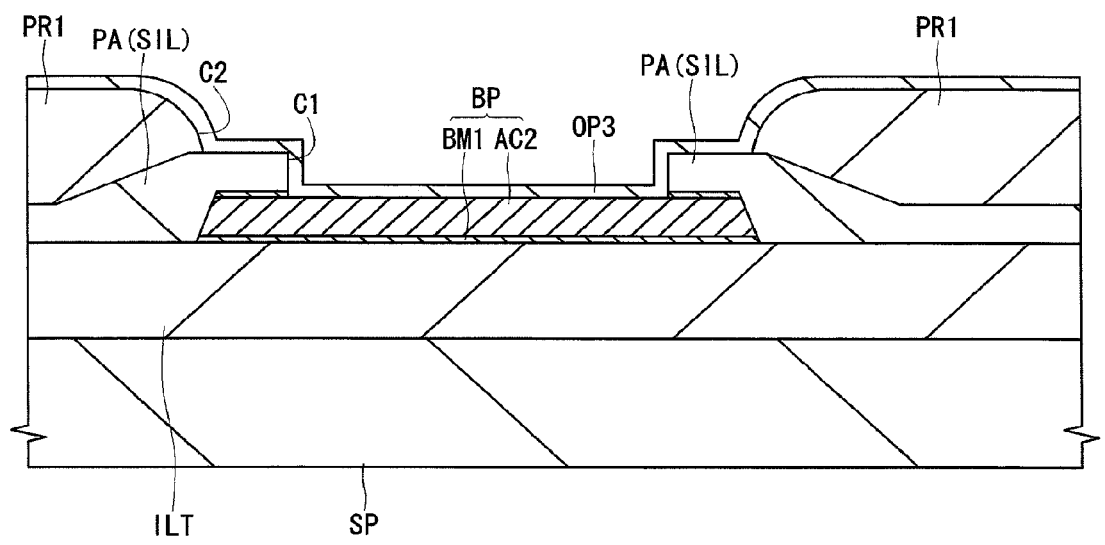
FIG. 12 is a cross-sectional view of a principal part of the same portion as that of FIG. 11 in processes of manufacturing the semiconductor device, continued from FIG. 11.

Next, as illustrated in FIG. 12, the silicon nitride film PA is coated with the polyimide resin PR1, and then, they are processed by a lithographic method, so that the opening C2 larger than the opening C1 is formed in the polyimide resin PR1 so as to overlap the opening C1.

Next, the OPM electrode film OP3 connected to the bonding pad BP via the openings C1 and C2 is formed on the principal surface of the semiconductor substrate Sp by a sputtering method. The OPM electrode film OP3 is formed of, for example, a Ti film, a Pd film, a Cr film, a Cu film, or a stacked film formed by stacking any of them, and has a thickness of, for example, 0.1 µm to 0.5 µm.

Before the formation of the OPM electrode film OP3, to reduce contact electric resistance between the OPM electrode film OP3 and the bonding pad BP, the upper surface of the bonding pad BP exposed from the opening C1 is cleaned by a sputter etching method.

Figure 13:
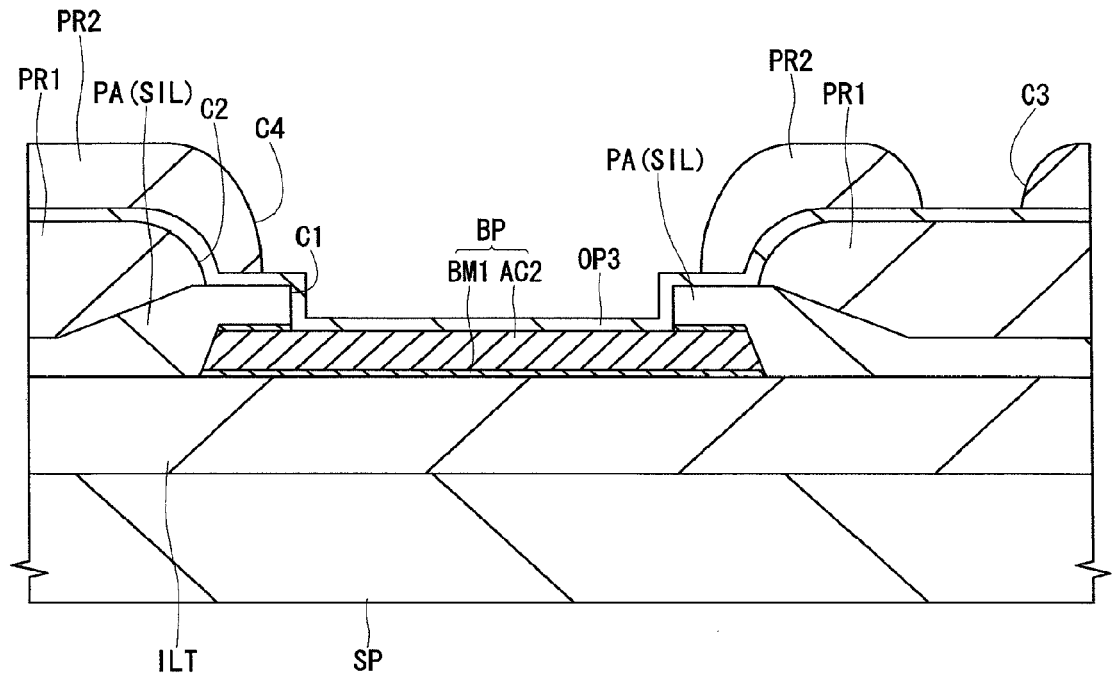
FIG. 13 is a cross-sectional view of a principal part of the same portion as that of FIG. 11 in processes of manufacturing the semiconductor device, continued from FIG. 12.

Next, as illustrated in FIG. 13, the OPM electrode film OP3 is coated with a resist film PR2. Subsequently, the resist film PR2 is processed by a lithographic method, so that an opening C4 larger than the opening C1 is formed in the resist film PR2 so as to overlap the opening C1, and an upper surface of the OPM electrode film OP3 in the bonding pad region is exposed from the opening C4. Further, the opening C3 is formed in a region different from the bonding pad region, so that an upper surface of the OPM electrode film OP3 in the region different from the bonding pad region is exposed from the opening C3.

Figure 14:
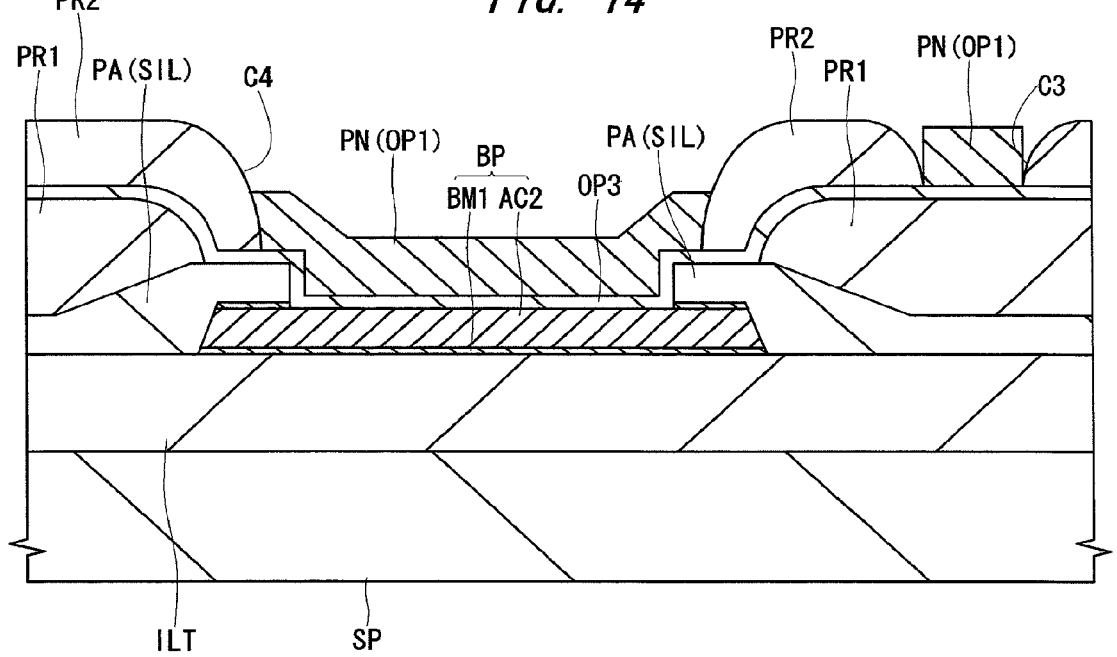
FIG. 14 is a cross-sectional view of a principal part of the same portion as that of FIG. 11 in processes of manufacturing the semiconductor device, continued from FIG. 13.

Next, as illustrated in FIG. 14, a Ni plating film PN (the OPM film OP1 in FIG. 10 described above) is grown on the part of the OPM electrode film OP3 exposed from the opening C4 and on the part of the OPM electrode film OP3 exposed from the opening C3 by an electroless plating method. A thickness of the Ni plating film PN is, for example, 0.5 μm to 4.0 μm, and, most preferably, for example, 1.0 μm to 3.0 μm. Instead of the Ni plating film PN, for example, a Ti plating film or others may be formed.

Figure 15:
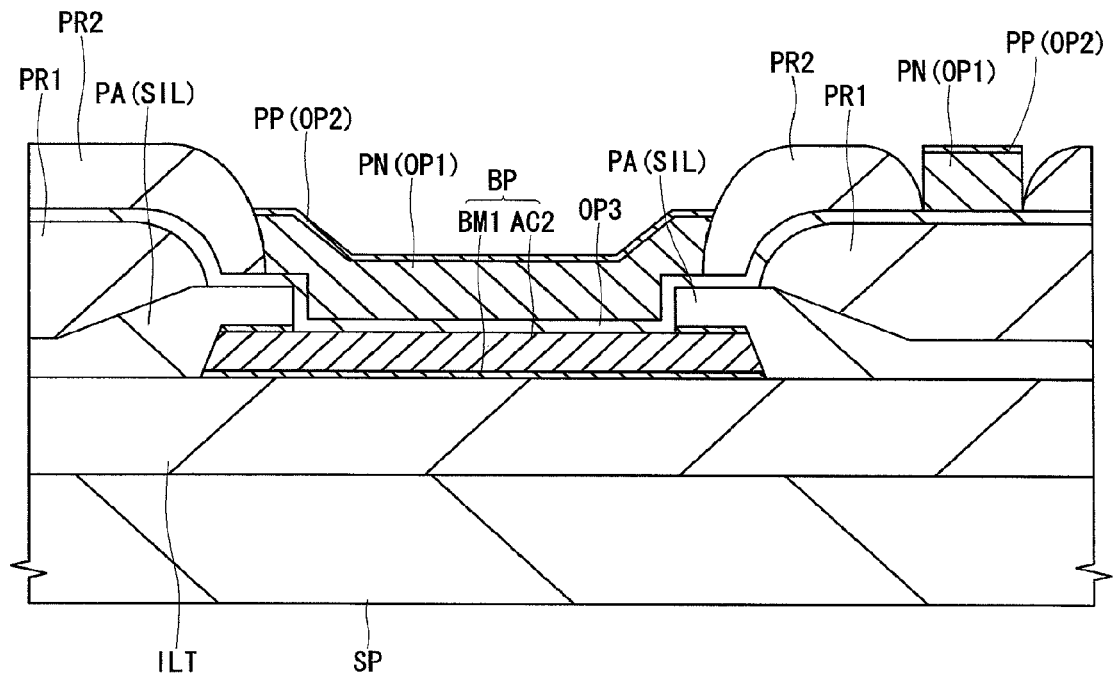
FIG. 15 is a cross-sectional view of a principal part of the same portion as that of FIG. 11 in processes of manufacturing the semiconductor device, continued from FIG. 14.

Next, as illustrated in FIG. 15, a Pd plating film PP (the OPM adhesion film OP2 in FIG. 10 described above) is grown on the Ni plating film PN by an electroless plating method. A thickness of the Pd plating film PP is, for example, 0.05 μm to 3.0 μm, and, most preferably, for example, 0.05 μm to 0.5 μm. Instead of the Pd plating film PP, for example, an Au plating film or others may be formed.

Figure 16:
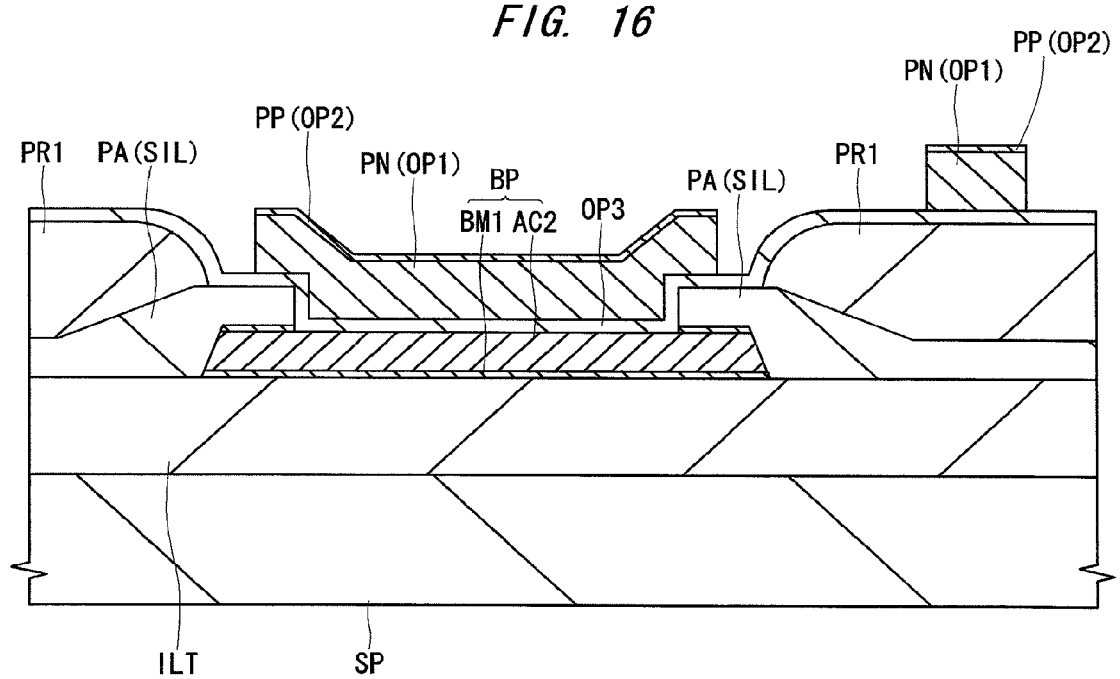
FIG. 16 is a cross-sectional view of a principal part of the same portion as that of FIG. 11 in processes of manufacturing the semiconductor device, continued from FIG. 15.

Next, as illustrated in FIG. 16, the resist film PR2 is removed.

Figure 17:
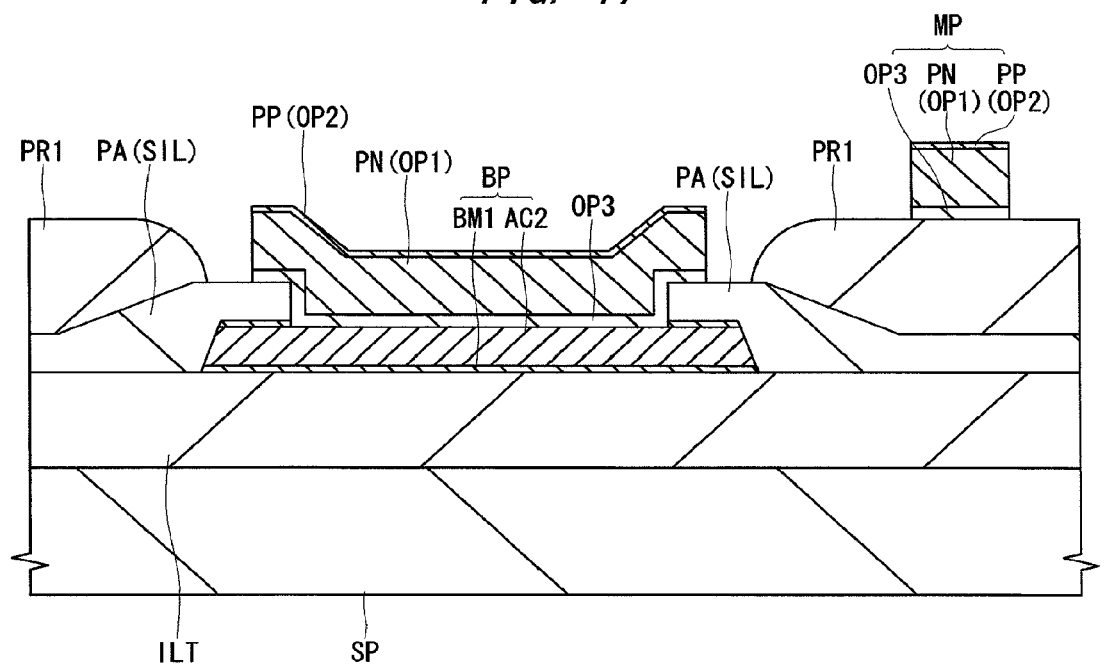
FIG. 17 is a cross-sectional view of a principal part of the same portion as that of FIG. 11 in processes of manufacturing the semiconductor device, continued from FIG. 16.

Next, as illustrated in FIG. 17, the exposed OPM electrode film OP3 is removed by a reactive plasma etching method. In this manner, a stacked film formed of the OPM electrode film OP3, the Ni plating film PN, and the Pd plating film PP is formed on the bonding pad BP, so that the bonding pad having the OPM structure is formed. Further, in the region different from the bonding pad region, the OPM wire MP is formed by a stacked film of the OPM electrode film OP3, the Ni plating film PN, and the Pd plating film PP.

Figure 18:
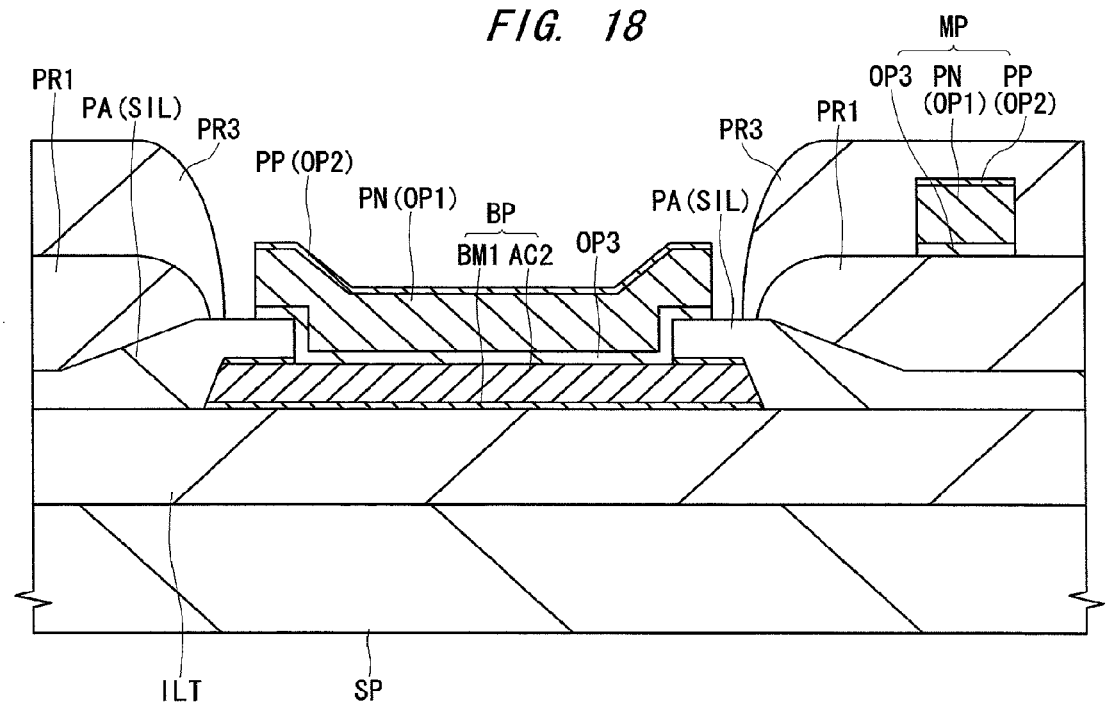
FIG. 18 is a cross-sectional view of a principal part of the same portion as that of FIG. 11 in processes of manufacturing the semiconductor device, continued from FIG. 17.

Next, as illustrated in FIG. 18, the principal surface of the semiconductor substrate SP is coated with a polyimide resin PR3. Subsequently, the polyimide resin PR3 is processed by a lithographic method, so that the region of the bonding pad having the OPM structure is exposed.

Figure 19:
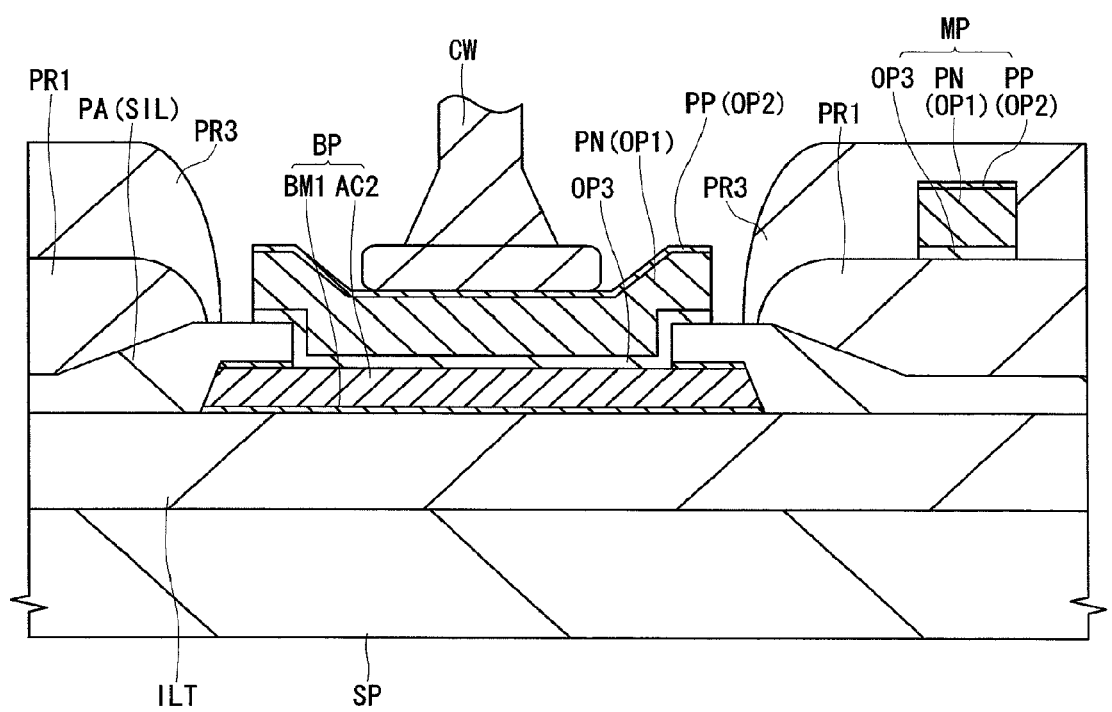
FIG. 19 is a cross-sectional view of a principal part of the same portion as that of FIG. 11 in processes of manufacturing the semiconductor device, continued from FIG. 18.

Then, the semiconductor substrate SP is separated into semiconductor chips by a dicing method, and the semiconductor chips are mounted on an upper surface of the die pad in each unit frame forming the lead frame that is separately prepared, and then, the Cu wire CW is compressed and bonded onto the upper surface of the Ni plating film PN via the Pd plating film PP as illustrated in FIG. 19.

In this manner, according to the modified example of the first embodiment, the bonding pad BP is formed of the hard Al—Cu alloy film to which the Cu of 2 wt % or more is added, so that the breakage of the OPM film OP1 (Ni plating film PN) in the bonding of the Cu wire CW can be prevented.

(Second Embodiment)

S<<tructure of Semiconductor Device>>

Figure 20:
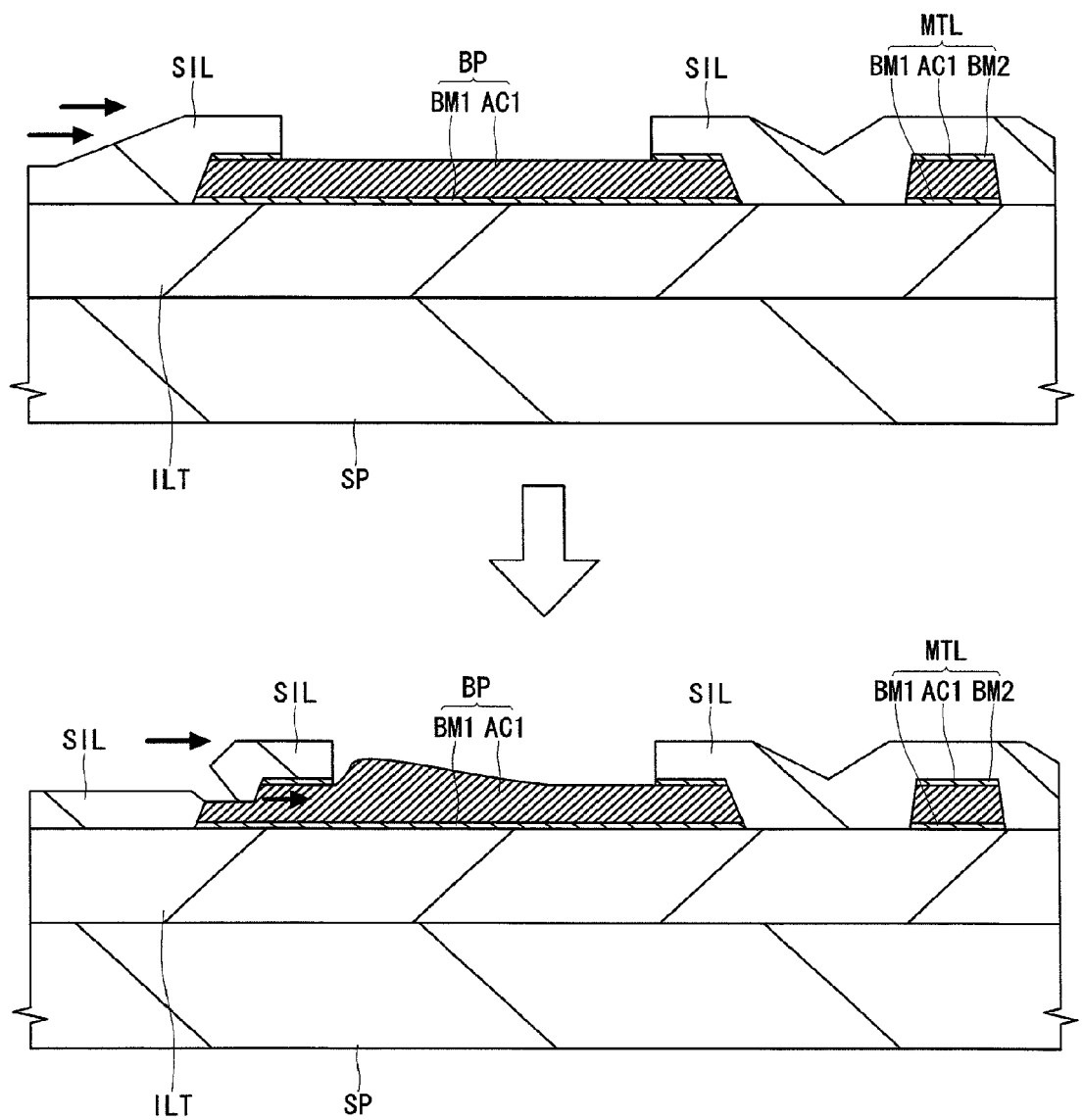
FIG. 20 is a cross-sectional view of a principal part of the bonding pad portion for explaining the breakage of the bonding pad caused at a corner of the semiconductor chip.
Figure 21:
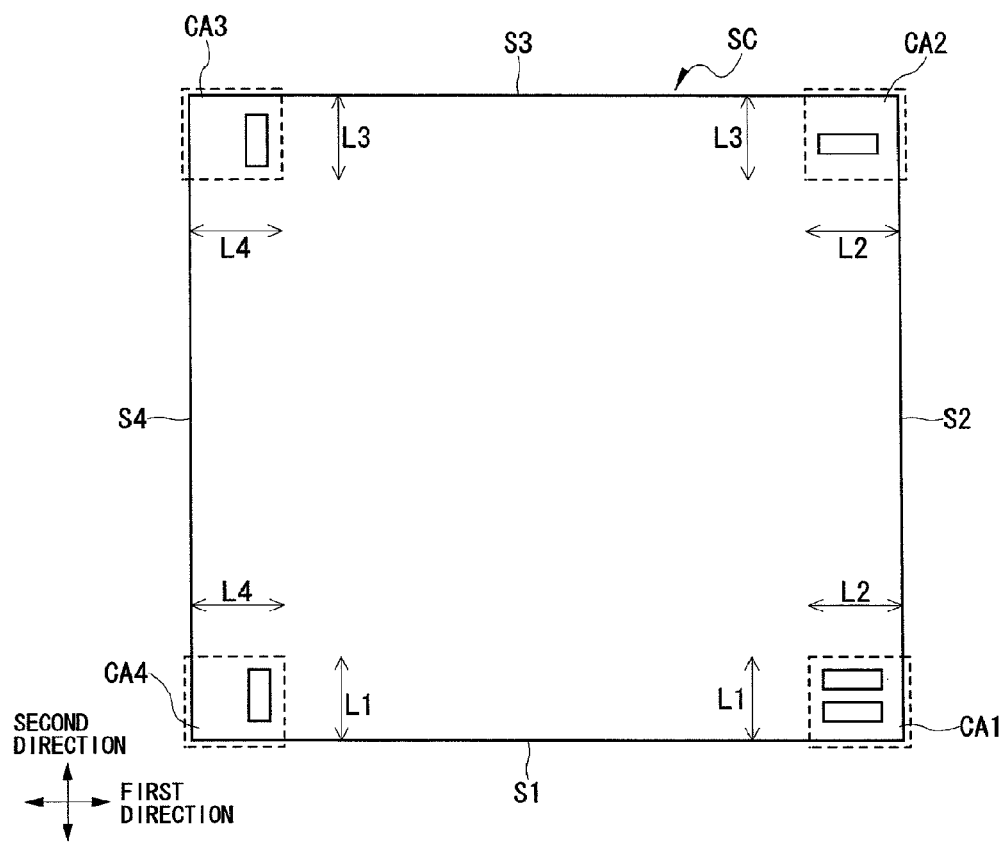
FIG. 21 is a plan view of a principal part of a semiconductor device according to a second embodiment.
Figure 22:
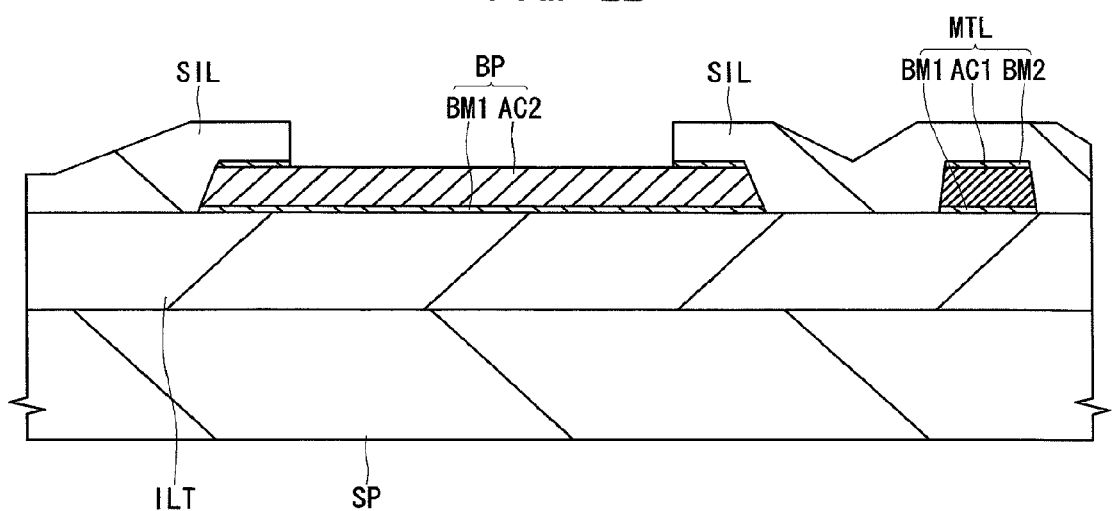
FIG. 22 is a cross-sectional view of a principle part of a bonding pad portion for explaining a configuration of a bonding pad according to the second embodiment.

A configuration of a semiconductor device according to a second embodiment will be described with reference to FIGS. 20 to 22. FIG. 20 is a cross-sectional view of a principal part of the bonding pad portion for explaining the breakage of the bonding pad caused at a corner of the semiconductor chip. FIG. 21 is a plan view of a principal part of the semiconductor device. FIG. 22 is a cross-sectional view of a principal part of the bonding pad portion for explaining a configuration of the bonding pad. In FIG. 21, note that a bonding pad arranged in a region except for a region close to the corner of the semiconductor chip is omitted.

When a sealing resin for sealing the semiconductor chip thermally shrinks, a shear stress in a lateral direction is generated on the bonding pad BP positioned close to the corner of the semiconductor chip. Therefore, as illustrated in FIG. 20, when the bonding pad BP is formed of the low-hardness Al—Cu alloy film AC1 (for example, having the Knoop hardness of 2.5 kg/mm$^2$) having the Cu concentration of less than 2 wt %, the stress concentrates on the end of the surface protective film SIL overlaid on the bonding pad BP, and the surface protective film SIL is broken.

Accordingly, as illustrated in FIG. 21, in regions close to four corners of the semiconductor chip, the bonding pad formed of the high-hardness Al—Cu alloy film (for example, having the Knoop hardness of 3 kg/mm$^2$ or higher) having the Cu concentration of 2 wt % or more (more preferably, 2 wt % to 10 wt %) is arranged.

In more detailed explanation, the semiconductor chip SC has a square shape having: a first side S1 extending in a first direction; a third side S3 opposite to the first side S1 and extending in the first direction; a second side S2 connected to one end of the first side S1 and to one end of the third side S3 and extending in a second direction orthogonal to the first direction; and a fourth side S4 connected to the other end of the first side S1 and to the other end of the third side S3 and extending in the second direction.

The bonding pad BP formed of the Al—Cu alloy film having the added Cu concentration of 2 wt % or more is arranged in a first region CA1 where a region extending from the first side S1 toward the inside of the semiconductor chip SC and having a first distance L1 in the second direction overlaps a region extending from the second side S2 toward the inside of the semiconductor chip SC and having a second distance L2 in the first direction. The first distance L1 is, for example, 5% of a length of the second side S2 or more, and the second distance L2 is, for example, 5% of a length of the first side S1 or more.

Similarly, the bonding pad BP formed of the Al—Cu alloy film having the added Cu concentration of 2 wt % or more is arranged in a second region CA2 where a region extending from the second side S2 toward the inside of the semiconductor chip SC and having the second distance L2 in the first direction overlaps a region extending from the third side S3 toward the inside of the semiconductor chip SC and having a third distance L3 in the second direction. The second distance L2 is, for example, 5% of a length of the third side S3 or more, and the third distance L3 is, for example, 5% of a length of the second side S2 or more.

Similarly, the bonding pad BP formed of the Al—Cu alloy film having the added Cu concentration of 2 wt % or more is arranged in a third region CA3 where a region extending from the third side S3 toward the inside of the semiconductor chip SC and having the third distance L3 in the second direction overlaps a region extending from the fourth side S4 toward the inside of the semiconductor chip SC and having a fourth distance L4 in the first direction. The third distance L3 is, for example, 5% of a length of the fourth side S4 or more, and the fourth distance L4 is, for example, 5% of a length of the third side S3 or more.

Similarly, the bonding pad BP formed of the Al—Cu alloy film having the added Cu concentration of 2 wt % or more is arranged in a fourth region CA4 where a region extending from the fourth side S4 toward the inside of the semiconductor chip SC and having the fourth distance L4 in the first direction overlaps a region extending from the first side S1 toward the inside of the semiconductor chip SC and having the first distance L1 in the first direction. The fourth distance L4 is, for example, 5% of a length of the first side S1 or more, and the first distance L1 is, for example, 5% of a length of the fourth side S4 or more.

Generally, since the length of the first side S1 is the same as the length of the third side S3, the second distance L2 is the same as the fourth distance L4. Since the length of the second side S2 is the same as the length of the fourth side S4, the first distance L1 is the same as the third distance L3.

In this manner, the bonding pad BP formed of the high-hardness Al—Cu alloy film having the added Cu concentration of 2 wt % or more is arranged in each of the regions (the first region CA1, the second region CA2, the third region CA3, and the fourth region CA4) positioned close to the four corners of the semiconductor chip, so that the breakage at the end of the surface protective film can be prevented.

That is, when the sealing resin sealing the semiconductor chip SC thermally shrinks, the shear stress in the lateral direction is applied to the bonding pad BP positioned close to the corners of the semiconductor chip. However, since the bonding pad BP is formed of the high-hardness Al—Cu alloy film having the added Cu concentration of 2 wt % or more, the deformation of the bonding pad BP can be suppressed. In this manner, the end of the surface protective film positioned on the upper surface of the bonding pad BP can be supported by the bonding pad BP, and therefore, the stress dose not concentrate on the end of the surface protective film overlaid on the bonding pad BP, so that the breakage of the surface protective film can be prevented.

The Cu of less than 2 wt % has been added to the Al—Cu alloy film forming the uppermost layer wire. The uppermost layer wire is made of the Al—Cu alloy film having the added Cu concentration of less than 2 wt %, and therefore, has low resistance, and can transmit signals at a high speed.

In the semiconductor chip SC illustrated in FIG. 21, note that the bonding pad BP formed of the Al—Cu alloy film having the added Cu concentration of 2 wt % or more is arranged in each of the regions (the first region CA1, the second region CA2, the third region CA3, and the fourth region CA4) positioned close to the four corners of the semiconductor chip SC. However, the arrangement is not limited to this. For example, all bonding pads formed on the principal surface of the semiconductor chip SC may be formed of the Al—Cu alloy film having the added Cu concentration of 2 wt % or more.

Also, the bonding pad BP may be either the bonding pad having the OPM structure in the above-described first embodiment or a bonding pad whose structure is not the OPM structure.

FIG. 22 illustrates an example of a semiconductor device having the bonding pad whose structure is not the OPM structure.

The structure does not have the OPM film OP1 and the OPM adhesion film OP2 in the bonding pad having the OPM structure illustrated in FIG. 1 described above, and the Cu wire CW is bonded directly to the bonding pad BP. Other structures are the same as those of the bonding pad having the OPM structure illustrated in FIG. 1 described above.

In this manner, according to the second embodiment, even if the sealing resin sealing the semiconductor chip SC thermally shrinks to generate the shear stress in the lateral direction on the bonding pad BP positioned close to the corners of the semiconductor chip SC, the deformation of the bonding pad BP can be suppressed since the bonding pad BP is formed of the high-hardness Al—Cu alloy film having the added Cu concentration of 2 wt % or more. In this manner, the end of the surface protective film positioned on the upper surface of the bonding pad BP can be supported by the bonding pad BP, and therefore, the stress dose not concentrate on the end of the surface protective film overlaid on the bonding pad BP, so that the breakage at the end of the surface protective film can be prevented.

(Modified Example of Second Embodiment)

<<Structure of Semiconductor Device>>

Figure 23:
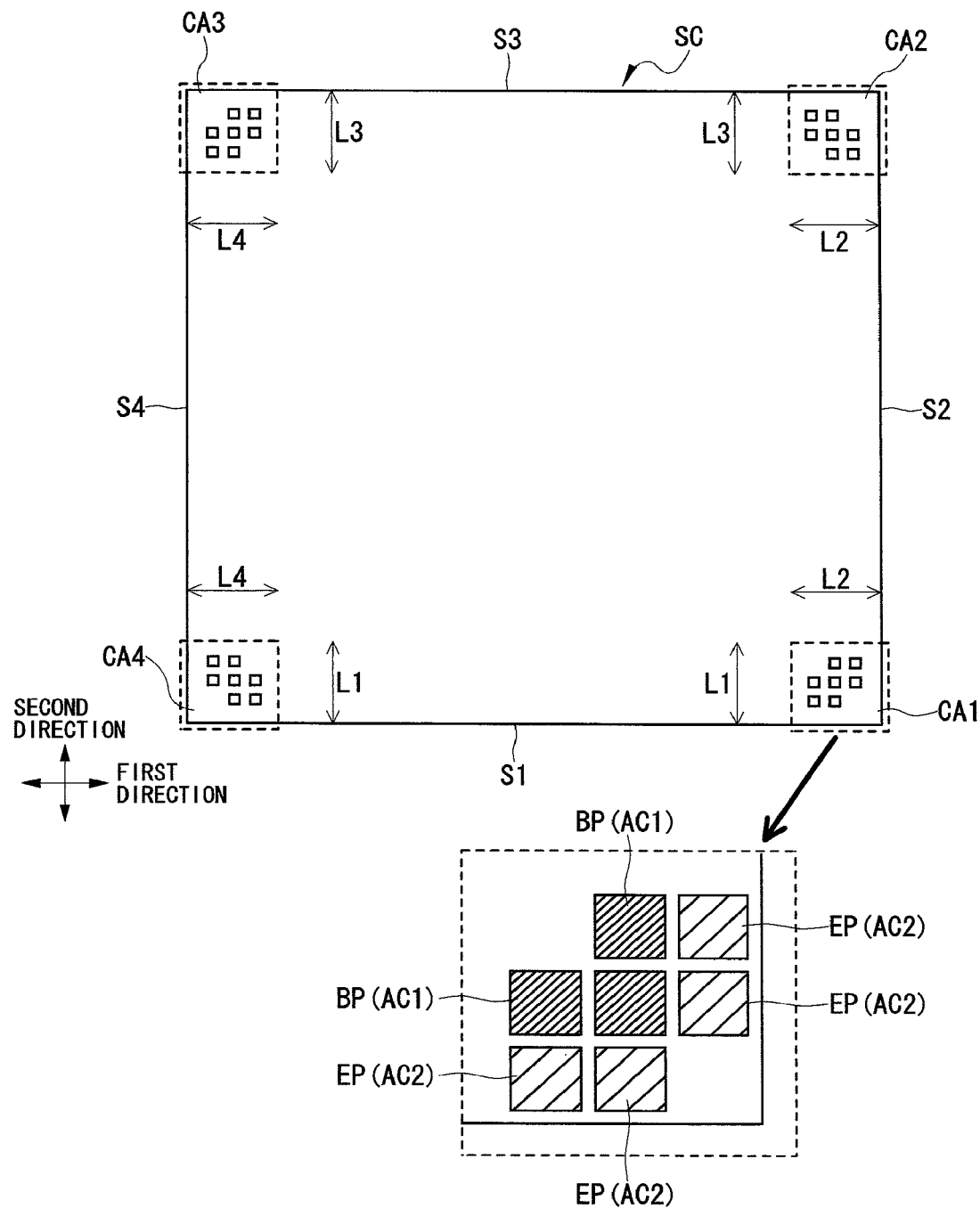
FIG. 23 is a plan view of a principal part of a semiconductor device according to a first modified example of the second embodiment.
Figure 24:
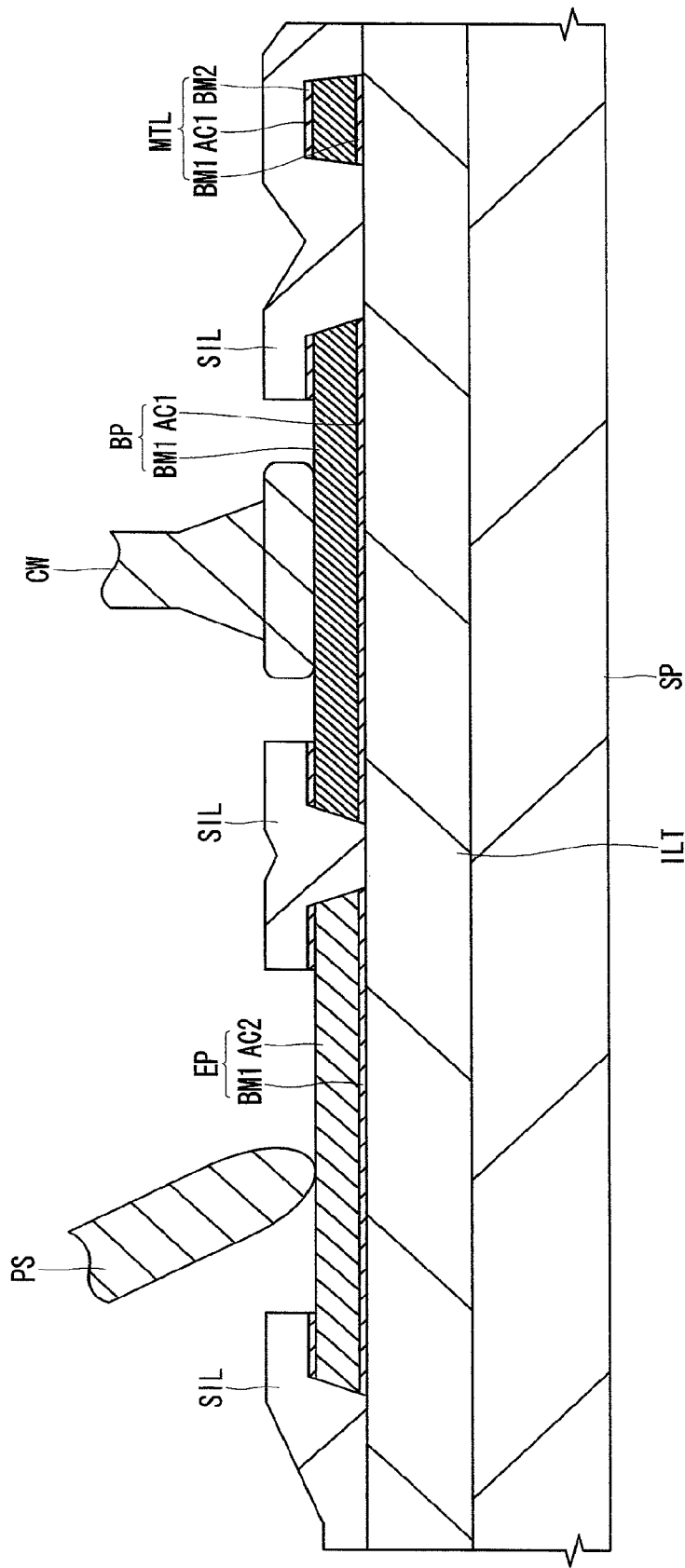
FIG. 24 is a cross-sectional view of a principle part of a bonding pad portion for explaining a configuration of a bonding pad according to the first modified example of the second embodiment.
Figure 25:
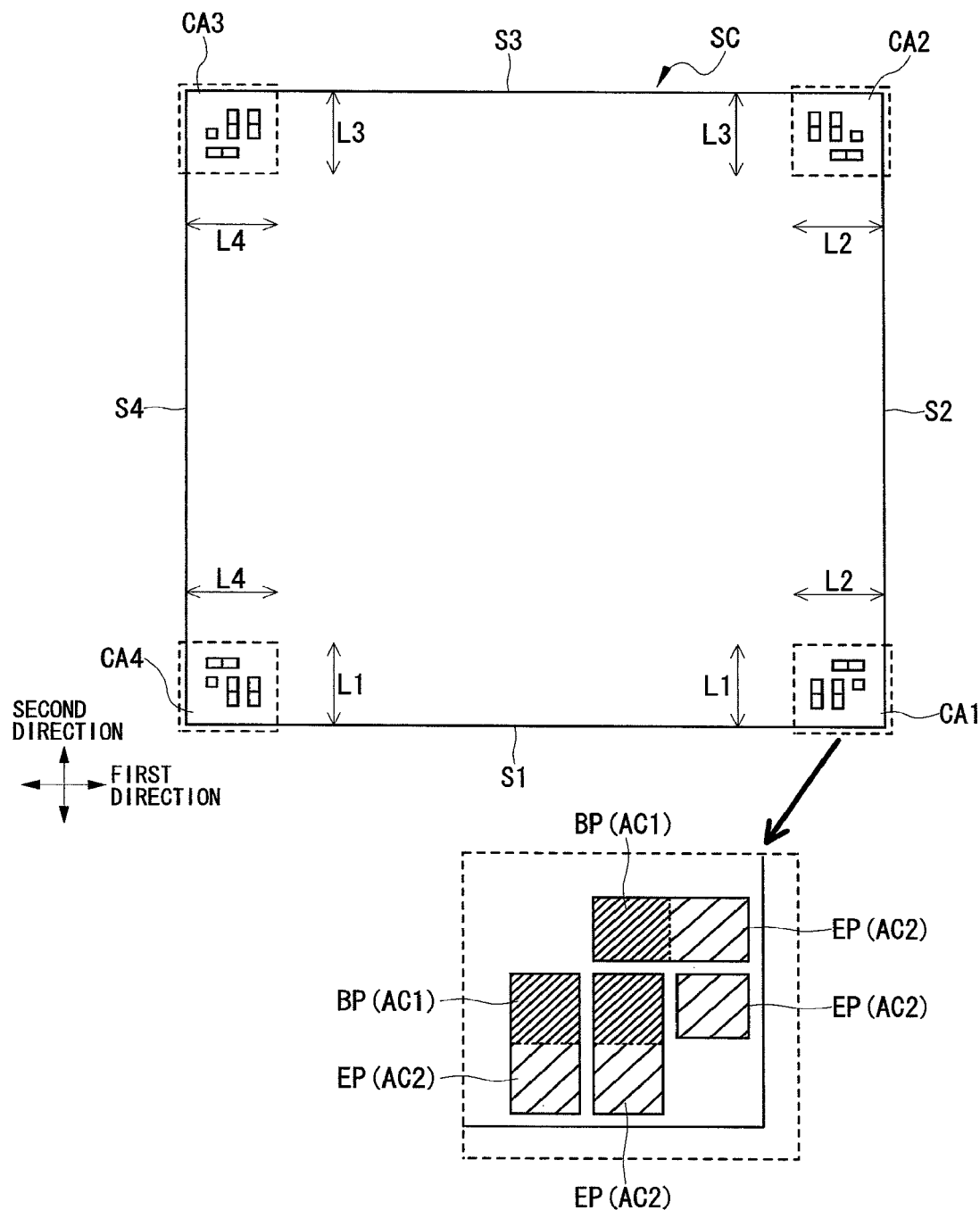
FIG. 25 is a plan view of a principal part of a semiconductor device according to a second modified example of the second embodiment.

A configuration of a semiconductor device according to a modified example of the second embodiment will be described with reference to FIGS. 23 to 25. FIG. 23 is a plan view of a principal part of a semiconductor device according to the first modified example. FIG. 24 is a cross-sectional view of a principal part of a bonding pad portion for explaining the configuration of the bonding pad according to the first modified example. FIG. 25 is a plan view of a principal part of a semiconductor device according to the second modified example. In FIGS. 23 to 25, note that the bonding pad for the Cu wire and the electrode pad for the measuring probe arranged in a region except for the regions close to the corners of the semiconductor chip are omitted.

In each of the regions positioned close to the four corners of the semiconductor chip, not only the bonding pad to be connected with the Cu wire but also the electrode pad to be contacted with the measuring probe may be arranged. The electrode pad to be contacted with the measuring probe is made of a conductive material in the same layer as the bonding pad to be bonded with the Cu wire.

FIG. 23 illustrates a plan view of a principal part of the semiconductor chip SC in which a plurality of (for example, four) electrode pads EP to be contacted with a measuring probe and a plurality of (for example, three) bonding pads BP to be bonded with the Cu wire are arranged in each of the regions (the first region CA1, the second region CA2, the third region CA3, and the fourth region CA4) positioned close to the four corners of the semiconductor chip SC.

A plurality of semiconductor devices are formed on the semiconductor substrate, and then, each semiconductor device is inspected for its electrical property. More specifically, in the electrical inspection, for example, a predetermined electric signal is transmitted from a tester which is electrically connected to a test board to the semiconductor device in such a state that a measuring probe (alternatively, also referred to as a probe pin or a contact pin) attached onto the test board is brought into contact with the electrode pad EP formed on the principal surface of the semiconductor substrate.

However, it is required to reduce the contact resistance between the measuring probe and the electrode pad EP, and therefore, a certain force is applied to the measuring probe when the measuring probe is brought into contact with the electrode pad EP. Therefore, when the electrode pad EP to be contacted with the measuring probe is formed of the low-hardness Al—Cu alloy film having the added Cu concentration of less than 2 wt %, there is a risk of the generation of the shear stress in the lateral direction on the electrode pad EP, which results in the breakage at the end of the surface protective film overlaid on the electrode pad EP.

Accordingly, as illustrated in FIGS. 23 and 24, the plurality of bonding pads BP are arranged along the periphery of the semiconductor chip SC in each of the regions (the first region CA1, the second region CA2, the third region CA3, and the fourth region CA4) positioned close to the four corners of the semiconductor chip, and the plurality of electrode pads EP are arranged between the periphery of the semiconductor chip SC and the plurality of bonding pads BP. And, each of the electrode pads EP is formed of the high-hardness Al—Cu alloy film AC2 having the added Cu concentration of 2 wt % or more, and each of the bonding pads BP is formed of the low-hardness Al—Cu alloy film AC1 having the added Cu concentration of less than 2 wt %.

In this manner, even if the shear stress in the lateral direction is generated on each electrode pad EP positioned close to the corners of the semiconductor chip SC by the contact of the measuring probe PS with the electrode pad EP for the measuring probe, the breakage at the end of the surface protective film SIL overlaid on the electrode pad EP can be prevented. That is, since the electrode pad EP is formed of the high-hardness Al—Cu alloy film AC2 having the Cu concentration of 2 wt % or more, the deformation of the electrode pad EP can be suppressed, so that the end of the surface protective film SIL can be supported by the electrode pad EP.

Also, even if the bonding pad BP for the Cu wire is formed of the Al—Cu alloy film AC1 having the added Cu concentration of less than 2 wt %, the shear stress in the lateral direction generated on the bonding pads BP caused by the thermal shrinkage of the sealing resin which seals the semiconductor chip SC is weaken since the bonding pads BP are separated away from the corners of the semiconductor chip SC, and therefore, the end of the surface protective film SIL overlaid on the bonding pads BP is difficult to be broken.

Note that the above-described FIGS. 23 and 24 illustrate the configuration example in which only the electrode pad EP for the measuring probe is formed of the high-hardness Al—Cu alloy film AC2 having the added Cu concentration of 2 wt % or more. However, both of the electrode pad EP for the measuring probe and the bonding pad BP for the Cu wire may be formed of the high-hardness Al—Cu alloy film AC2 having the added Cu concentration of 2 wt % or more.

Also, in FIGS. 23 and 24 described above, the electrode pad EP for the measuring probe and the bonding pad BP for the Cu wire are formed separately. However, as illustrated in FIG. 25, the electrode pad EP and the bonding pad BP may be formed of one Al—Cu alloy film so that the electrode pad EP is formed of the high-hardness Al—Cu alloy film AC2 having the added Cu concentration of 2 wt % or more and so that the bonding pad BP is formed of the low-hardness Al—Cu alloy film AC1 having the added Cu concentration of less than 2 wt %.

Also in this case, both of the electrode pad EP for the measuring prove and bonding pad BP for the Cu wire may be formed of the high-hardness Al—Cu alloy film AC2 having the added Cu concentration of 2 wt % or more.

<<Method of Manufacturing Semiconductor Device>>

Next, an example of a method of manufacturing the semiconductor device according to the first modified example of the second embodiment will then be described in the order of steps with reference to FIGS. 26 to 29. FIGS. 26 to 29 are cross-sectional views of principal parts illustrating an enlarged region of the bonding pad. Note that the above-described semiconductor device according to the second embodiment is manufactured by the same manufacturing method.

Figure 26:
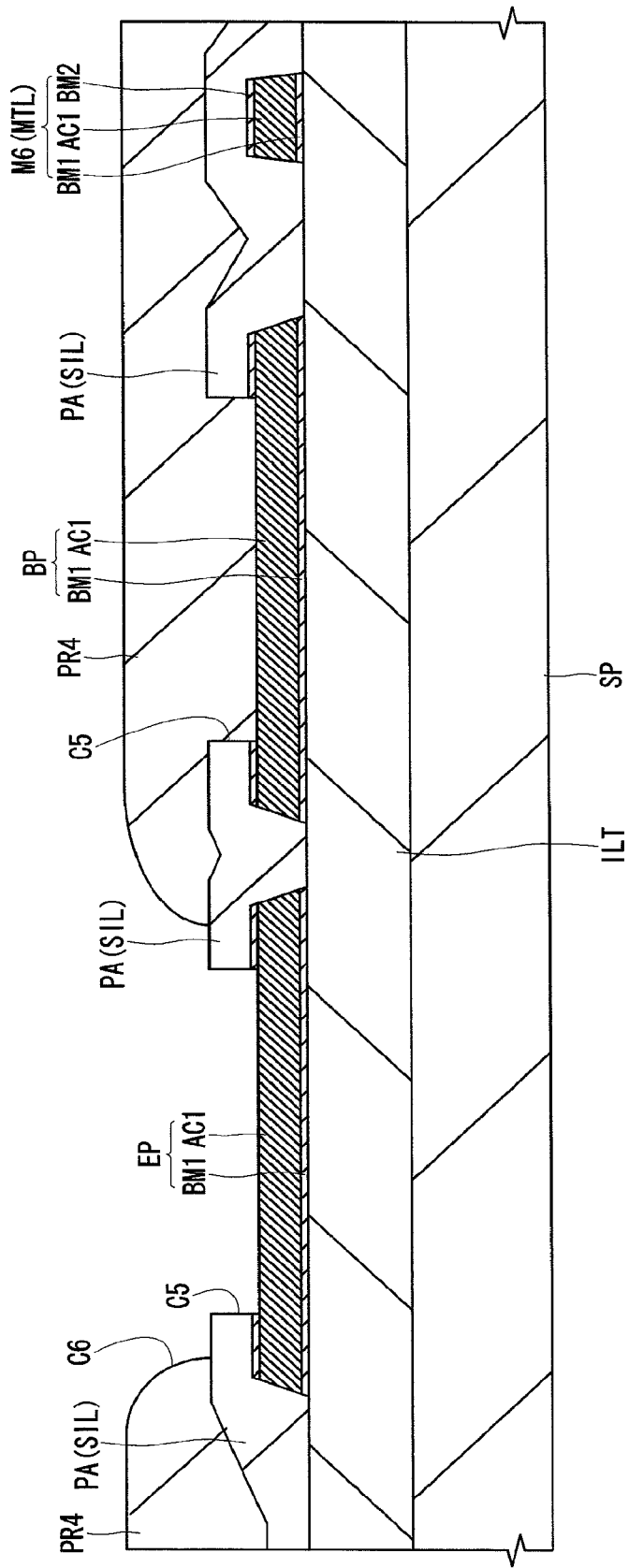
FIG. 26 is a cross-sectional view of a principal part illustrating an enlarged region of the bonding pad for explaining a method of manufacturing the semiconductor device according to the first modified example of the second embodiment.

As illustrated in FIG. 26, the sixth layer wire M6 (which is the uppermost layer wire MTL in FIG. 24 described above), the electrode pad EP for the measuring probe, and the bonding pad BP for the Cu wire are formed on the insulating film ILT as in the explanation with reference to FIGS. 4 and 5 described above. Here, the Cu concentration added to the Al—Cu alloy film AC1 forming the wire M6, the electrode pad EP, and the bonding pad BP is less than 2 wt %, and a thickness of the Al—Cu alloy film AC1 is, for example, 0.3 µm to 3.0 µm, and, most preferably, for example, 0.8 µm to 2.0 µm.

Next, the silicon nitride film PA (which is the surface protective film SIL in FIG. 24 described above) is formed on the principal surface of the semiconductor substrate SP, and then, an opening C5 from which a part of each upper surface of the electrode pad EP and the bonding pad BP is formed in the silicon nitride film PA. Subsequently, the silicon nitride film PA is coated with a resist film PR4, and then the resist film PR4 is processed by a lithographic method, so that an opening C6 larger than the opening C5 is formed in the resist film PR4 so as to overlap the opening C5 from which the part of the upper surface of the electrode pad EP is exposed.

Figure 27:
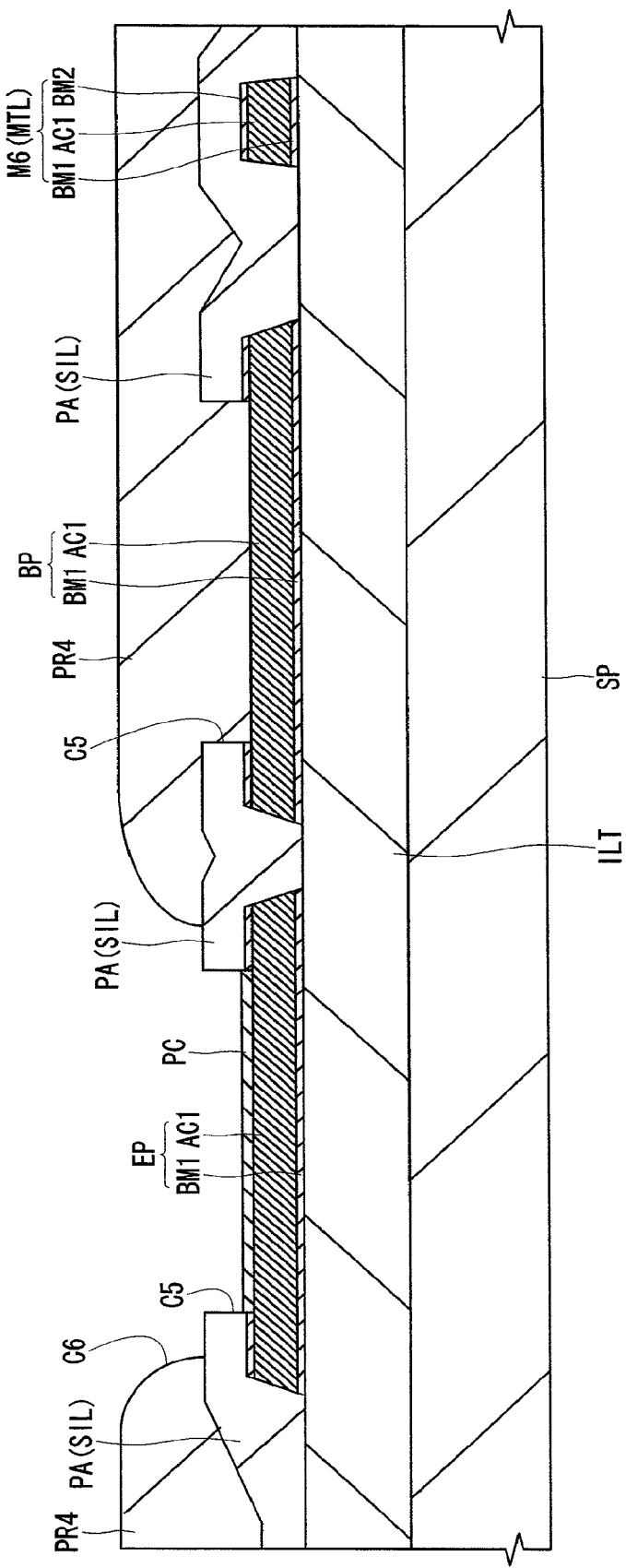
FIG. 27 is a cross-sectional view of a principal part of the same portion as that of FIG. 26 in processes of manufacturing the semiconductor device, continued from FIG. 26.

Next, as illustrated in FIG. 27, a Cu plating film PC is grown on the upper surfaces of the electrode pad EP exposed from the openings C5 and C6 by an electroless plating method. A thickness of the Cu plating film PC is, for example, about 5.0 nm to 10 nm.

Figure 28:
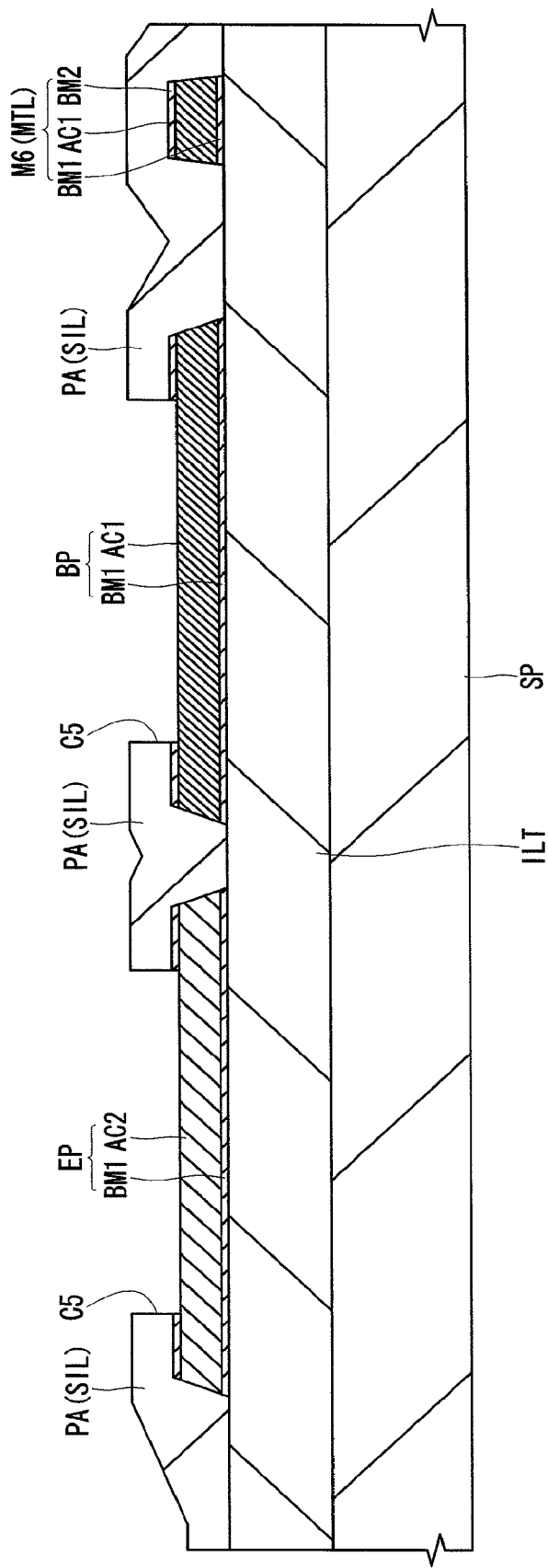
FIG. 28 is a cross-sectional view of a principal part of the same portion as that of FIG. 26 in processes of manufacturing the semiconductor device, continued from FIG. 27.

Next, as illustrated in FIG. 28, the Cu is diffused from the Cu plating film PC to the electrode pad EP by performing a heat treatment to the semiconductor substrate SP at, for example, about 400° C., so that the Al—Cu alloy film AC1 forming the electrode pad EP is modified to the Al—Cu alloy film AC2 having the Cu concentration of 2 wt % or more.

Next, the resist film PR4 is removed. In this manner, the upper surface of the bonding pad BP is exposed. Subsequently, the measuring probe is brought into contact with the electrode pad EP, and the electrical properties of a plurality of semiconductor elements, etc., formed on the principal surface of the semiconductor substrate SP are measured.

Figure 29:
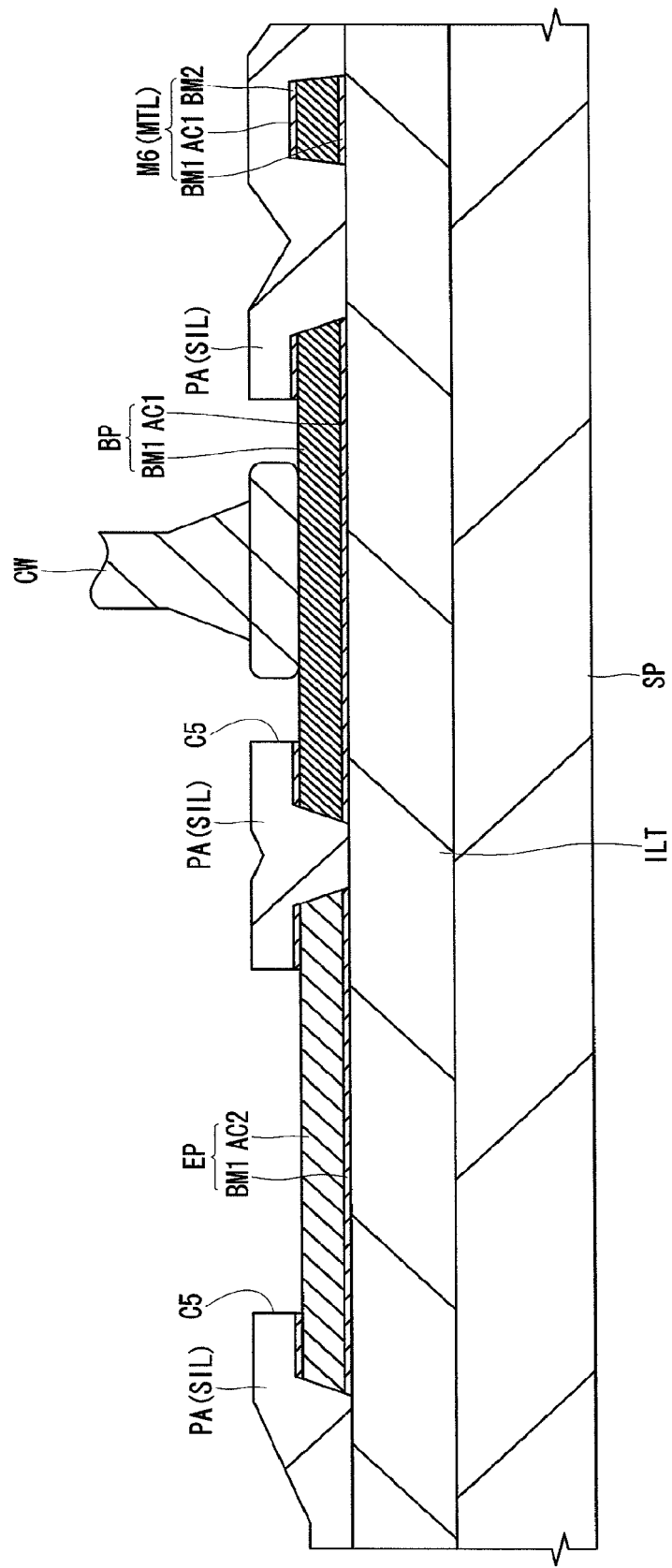
FIG. 29 is a cross-sectional view of a principal part of the same portion as that of FIG. 26 in processes of manufacturing the semiconductor device, continued from FIG. 28.

Then, the semiconductor substrate SP is separated into semiconductor chips by a dicing method, and the semiconductor chip is mounted on the upper surface of the die pad of each unit frame forming the lead frame that is separately prepared, and then, the Cu wire CW is compressed and bonded to the upper surface of the bonding pad BP as illustrated in FIG. 29.

As described above, according to the modified example of the second embodiment, even if the shear stress in the lateral direction is generated on the electrode pad EP by the contact of the measuring probe PS, the deformation of the electrode pad EP can be suppressed since the electrode pad EP is formed of the high-hardness Al—Cu alloy film AC2 having the added Cu concentration of 2 wt % or more. In this manner, the end of the surface protective film SIL can be supported by the electrode pad EP, and therefore, the stress dose not concentrate on the end of the surface protective film SIL overlaid on the electrode pad EP, so that the breakage at the end of the surface protective film SIL can be prevented.

In the foregoing, the invention made by the inventors has been concretely described based on the embodiments. However, it is needless to say that the present invention is not limited to the foregoing embodiments and various modifications and alterations can be made within the scope of the present invention.

The present invention includes at least the following embodiments.

[Item 1]

A semiconductor device has: a first insulating film formed on a principal surface of a semiconductor substrate; an electrode pad formed on the first insulating film and formed of an alloy film to which Cu is added; a second insulating film formed on the principal surface of the semiconductor substrate so as to cover the electrode pad; and a first opening formed in the second insulating film so as to expose a part of an upper surface of the electrode pad. In the semiconductor device, a concentration of the Cu added to the alloy film forming the electrode pad is 2 wt % or more.

[Item 2]

In the semiconductor device according to the item 1, the concentration of the Cu of the alloy film forming the electrode pad is 2 wt % to 10 wt %.

[Item 3]

In the semiconductor device according to the item 1, the alloy film forming the electrode pad is an Al—Cu alloy film.

[Item 4]

In the semiconductor device according to the item 1, Knoop hardness of the alloy film forming the electrode pad is 3 kg/mm$^2$ or higher.

[Item 5]

In the semiconductor device according to the item 1, a Cu wire is bonded to the electrode pad.

[Item 6]

A semiconductor device has: a first insulating film formed on a principal surface of a semiconductor substrate; a first electrode pad, a second electrode pad, and a wire each formed on the first insulating film so that they are separated away from each other, and each formed of an alloy film to which Cu is added in the same layer as each other; a second insulating film formed on the principal surface of the semiconductor substrate so as to cover the first electrode pad, the second electrode pad, and the wire; a first opening formed in the second insulating film so as to expose a part of an upper surface of the first electrode pad; and a second opening formed in the second insulating film so as to expose a part of an upper surface of the second electrode pad. In the semiconductor device, a concentration of the Cu added to the alloy film forming the first electrode pad is 2 wt % or more, concentrations of the Cu added to the alloy films forming the second electrode pad and the wire are less than 2 wt %, the second electrode pad is arranged along periphery of a semiconductor chip, and the first electrode pad is arranged between the periphery of the semiconductor chip and the second electrode pad.

[Item 7]

In the semiconductor device according to the item 6, the semiconductor chip has a square shape having: a first side extending in a first direction and a second side extending in a second direction orthogonal to the first direction, and the first electrode pad is arranged in a first region where a region extending from the first side toward inside of the semiconductor chip and having a first distance in the second direction overlaps a region extending from the second side toward the inside of the semiconductor chip and having a second distance in the first direction.

[Item 8]

In the semiconductor device according to the item 7, the first distance is 5% of a length of the second side or more, and the second distance is 5% of a length of the first side or more.

[Item 9]

In the semiconductor device according to the item 6, a measuring probe is brought into contact with the first electrode pad, and a Cu wire is bonded to the second electrode pad.

What is claimed is:

1. A method of manufacturing a semiconductor device comprising:
    (a) forming a first insulating film over a principal surface of a semiconductor substrate;
    (b) over the first insulating film, sequentially forming a first barrier metal film, a first Al—Cu alloy film to which Cu having a first concentration is added, and a second barrier metal film;
    (c) processing the first barrier metal film, the first Al—Cu alloy film, and the second barrier metal film so as to form an electrode pad and a wire, each of which is formed of the first barrier metal film, the first Al—Cu alloy film, and the second barrier metal film so that the electrode pad and the wire are separated from each other;
    (d) forming a second insulating film over the principal surface of the semiconductor substrate so as to cover the electrode pad and the wire;
    (e) forming, in the second insulating film, a first opening from which the second barrier metal film is exposed, by removing the second insulating film on the electrode pad, and exposing a part of an upper surface of the first Al—Cu alloy film forming the electrode pad from the first opening by removing the second barrier metal film exposed from the first opening;
    (f) forming a Cu film on the exposed part of the upper surface of the first Al—Cu alloy film forming the electrode pad by an electroless plating method; and
    (g) forming a second Al—Cu alloy film to which Cu having a second concentration higher than the first concentration is added by diffusing the Cu by a heat treatment from the Cu film to the first Al—Cu alloy film forming the electrode pad; and further comprising, after (g):
    (h) coating the second insulating film with a resin, and then, forming a second opening larger than the first opening in the resin so as to overlap the first opening;
    (i) forming a plating electrode film connected to the second Al—Cu alloy film on the resin including inner walls of the first opening and the second opening;
    (j) coating the plating electrode film with a resist film, and then, forming a third opening larger than the first opening in the resist film so as to overlap the first opening;
    (k) forming a plating film on an upper surface of the plating electrode film exposed from a bottom of the third opening by an electroless plating method;
    (l) forming a plating adhesion film on a surface of the plating film by an electroless plating method;
    (m) removing the resist film; and
    (n) removing the exposed plating electrode film.

2. The method of manufacturing the semiconductor device according to claim 1,
    wherein the concentration of the Cu of the first Al—Cu alloy film is less than 2 wt %, and the concentration of the Cu of the second Al—Cu alloy film is 2 wt % or more.

3. The method of manufacturing the semiconductor device according to claim 1,
    wherein Knoop hardness of the second Al—Cu alloy film is 3 kg/mm$^2$ or higher.

4. The method of manufacturing the semiconductor device according to claim 1,
    wherein the plating film is formed of a Ni film, a Ti film, a Cr film, or a stacked film formed by stacking any of them, and the plating adhesion film is formed of a Pd film, a Au film, or a stacked film formed by stacking the Pd film and the Au film.

5. The method of manufacturing the semiconductor device according to claim 1,
wherein the plating film is formed of a Ni film, a Ti film, a Cr film, or a stacked film formed by stacking any of them, the plating adhesion film is formed of a Pd film, a Au film, or a stacked film formed by stacking the Pd film and the Au film, and the plating electrode film is formed of a Ti film, a Pd film, a Cr film, a Cu film, or a stacked film formed by stacking any of them.

\* \* \* \* \*